(12) United States Patent
Dollase et al.

(10) Patent No.: US 11,447,669 B2
(45) Date of Patent: *Sep. 20, 2022

(54) WATER VAPOR-BLOCKING ADHESIVE COMPOUND HAVING HIGHLY FUNCTIONALIZED POLY(METH)ACRYLATE

(71) Applicant: TESA SE, Norderstedt (DE)

(72) Inventors: Thilo Dollase, Hamburg (DE); Jessika Gargiulo, Hamburg (DE); Marco Kupsky, Quickborn (DE); Bastian Wedel, Hamburg (DE)

(73) Assignee: TESA SE, Norderstedt (DE)

( * ) Notice: Subject to any disclaimer, the term of this patent is extended or adjusted under 35 U.S.C. 154(b) by 63 days.

This patent is subject to a terminal disclaimer.

(21) Appl. No.: 16/998,508

(22) Filed: Aug. 20, 2020

(65) Prior Publication Data
US 2020/0377766 A1 Dec. 3, 2020

Related U.S. Application Data

(62) Division of application No. 16/097,779, filed as application No. PCT/EP2017/056048 on Mar. 15, 2017, now abandoned.

(30) Foreign Application Priority Data

May 2, 2016 (DE) ...................... 10 2016 207 540.3

(51) Int. Cl.
*C09J 133/06* (2006.01)
*C09J 11/06* (2006.01)
(Continued)

(52) U.S. Cl.
CPC .......... *C09J 133/068* (2013.01); *C08L 33/06* (2013.01); *C09J 5/06* (2013.01); *C09J 7/22* (2018.01);
(Continued)

(58) Field of Classification Search
CPC ... C09J 133/068; C09J 5/06; C09J 7/22; C09J 7/385; C09J 11/06; C09J 2203/326;
(Continued)

(56) References Cited

U.S. PATENT DOCUMENTS

| 4,552,604 A | 11/1985 | Green |
| 5,242,715 A | 9/1993 | Schoen et al. |

(Continued)

FOREIGN PATENT DOCUMENTS

| AU | 199919664 B2 | 6/1999 |
| CN | 104854207 A | 9/2015 |

(Continued)

OTHER PUBLICATIONS

Machine translation of JP 2003-336025A (Year: 2003).*
(Continued)

*Primary Examiner* — Scott R. Walshon
(74) *Attorney, Agent, or Firm* — Norris McLaughlin, P.A.

(57) ABSTRACT

Single- or double-sided adhesive tapes and methods at least partly encapsulate an (opto)electronic structure. The tapes and method include a carrier and at least one layer of a curable adhesive composition having the following components: (A) 20% to 99.9% by weight (based on the entirety of the curable adhesive composition) of a (co)polymer functionalized with epoxy groups and having a weight-average molar mass of at least 5000 g/mol, based on more than 30% to 100% by weight, (based on the entirety of the parent monomers of the epoxy-functionalized (co)polymer) of at least one type of (meth)acrylic (co)monomer (a) functionalized with an epoxy group; and (B) 0.1% to 5% by weight (based on the entirety of the curable adhesive composition) of at least one curing agent configured to induce curing of the (co)polymer (A) with reaction of its epoxy groups by thermal means and/or by supply of UV radiation.

17 Claims, 4 Drawing Sheets

(51) Int. Cl.
*C09J 7/22* (2018.01)
*H01L 51/52* (2006.01)
*H01L 51/56* (2006.01)
*C08L 33/06* (2006.01)
*C09J 7/38* (2018.01)
*C09J 5/06* (2006.01)

(52) U.S. Cl.
CPC ............... *C09J 7/385* (2018.01); *C09J 11/06* (2013.01); *H01L 51/5253* (2013.01); *H01L 51/56* (2013.01); *C08F 2800/20* (2013.01); *C09J 2203/326* (2013.01); *C09J 2301/302* (2020.08); *C09J 2301/312* (2020.08); *C09J 2433/00* (2013.01)

(58) Field of Classification Search
CPC ............ C09J 2301/302; C09J 2301/312; C09J 2433/00; H01L 51/5253; H01L 51/56; C08F 2800/20
See application file for complete search history.

(56) References Cited

U.S. PATENT DOCUMENTS

| | | | |
|---|---|---|---|
| 5,789,487 | A | 8/1998 | Matyjaszewski et al. |
| 5,854,364 | A | 12/1998 | Senninger et al. |
| 5,945,491 | A | 8/1999 | Matyjaszewski et al. |
| 6,235,850 | B1 | 5/2001 | Perez et al. |
| 6,319,603 | B1 | 11/2001 | Komiya et al. |
| 6,521,732 | B2 | 2/2003 | Perez et al. |
| 6,599,960 | B1 | 7/2003 | Eckhardt et al. |
| 7,135,224 | B2 | 11/2006 | Sumi et al. |
| 10,035,930 | B2 | 7/2018 | Zajaczkowski et al. |
| 10,808,153 | B2 * | 10/2020 | Dollase ................ C08L 33/068 |
| 2001/0031837 | A1 | 10/2001 | Perez et al. |
| 2003/0111175 | A1 * | 6/2003 | Fink ..................... C09J 133/068 156/330 |
| 2004/0232563 | A1 | 11/2004 | Sumi et al. |
| 2007/0135552 | A1 | 6/2007 | Wrosch et al. |
| 2007/0026572 | A1 | 12/2007 | Hatakeyama et al. |
| 2010/0137530 | A1 | 6/2010 | Arai et al. |
| 2014/0322526 | A1 * | 10/2014 | Dollase ................. B32B 17/10 522/112 |
| 2014/0367670 | A1 | 12/2014 | Yamamoto et al. |
| 2015/0255633 | A1 | 9/2015 | Sukata |
| 2015/0306845 | A1 * | 10/2015 | Dollase ..................... C09J 7/35 156/60 |
| 2019/0144724 | A1 | 5/2019 | Dollase et al. |
| 2019/0169470 | A1 | 6/2019 | Dollase et al. |

FOREIGN PATENT DOCUMENTS

| | | |
|---|---|---|
| DE | 19949352 A1 | 4/2000 |
| DE | 19519499 B4 | 5/2005 |
| DE | 102008047964 A1 | 3/2010 |
| EP | 0393893 A1 | 10/1990 |
| EP | 0620259 A2 | 10/1994 |
| EP | 0819746 A2 | 1/1998 |
| EP | 0914027 A1 | 5/1999 |
| EP | 0721975 B1 | 2/2000 |
| EP | 1028151 B1 | 4/2002 |
| EP | 0894841 B1 | 5/2003 |
| EP | 1308492 B1 | 9/2005 |
| EP | 1743928 A1 | 1/2007 |
| JP | 2003336025 | 11/2003 |
| JP | 2008150406 | 7/2008 |
| JP | 2012-046738 A | 3/2012 |
| JP | 2012121927 A | 6/2012 |
| JP | 2014062057 A | 4/2014 |
| KR | 10-0755175 B1 | 9/2007 |
| KR | 10-0770228 B1 | 10/2007 |
| WO | 96/24620 A1 | 8/1996 |
| WO | 98/01478 A1 | 1/1998 |
| WO | 9821287 A1 | 5/1998 |
| WO | 98/44008 A1 | 10/1998 |
| WO | 99/31144 A1 | 6/1999 |
| WO | 9957216 A1 | 11/1999 |
| WO | 0226908 A1 | 4/2002 |
| WO | 2004/041943 A1 | 5/2004 |
| WO | 2009075971 A2 | 6/2009 |
| WO | 2011112643 A2 | 9/2011 |
| WO | 2012165259 A1 | 12/2012 |
| WO | 2013101693 A1 | 7/2013 |
| WO | 2013/156509 A2 | 10/2013 |
| WO | 2014/059055 A1 | 4/2014 |
| WO | 2014/059058 A1 | 4/2014 |
| WO | 2015/048012 A1 | 4/2015 |
| WO | 2015082143 A1 | 6/2015 |

OTHER PUBLICATIONS

German Search report for corresponding application DE 10 2016 207 540.3 dated Jan. 16, 2017.
International Search Report for corresponding application PCT/EP2017/056048 dated Jun. 1, 2017.
German Search report for corresponding application DE 10 2016 207 548.9 dated Jan. 16, 2017.
International Search Report for corresponding application PCT/EP2017/059166 dated Jun. 26, 2017.
Crivello, J.V.; "The Discovery and Development of Onium Salt Cationic Photoinitiators", J. Polym. Sci., Part A: Pol A: Polym. Chem., 1998, vol. 37, pp. 4241-4254.
Fox, T., et al; "The Glass Temperature and Related Properties of Poly-styrene. Influence of Molecular Weight", J. Polym. Sci., 1954, vol. 14, pp. 315-319.
Office Action dated Sep. 24, 2019, issued in connection with Japanese Patent Application No. 2018-557318.
English translation of Korean Office Action dated May 22, 2020, in connection with Korean Application No. 10-2018-7034833.
Office Action dated Mar. 16, 2020, issued in connection with Chinese Patent Application No. 201780034327.2.

* cited by examiner

WATER VAPOR-BLOCKING ADHESIVE COMPOUND HAVING HIGHLY FUNCTIONALIZED POLY(METH)ACRYLATE

CROSS-REFERENCE TO RELATED APPLICATIONS

This is a divisional patent application of U.S. Ser. No. 16/097,779 filed 3 Oct. 2018, which in turn was a 371 of PCT/EP2017/056048 filed 15 Mar. 2017, which claims foreign priority benefit under 35 U.S.C. 119 of German Patent Application 10 2016 207 540.3 filed 2 May 2016, the entire contents of which are incorporated herein by reference.

The present invention relates to a water vapor barrier adhesive composition comprising an adhesive base composed of at least one poly(meth)acrylate highly functionalized with epoxy groups, at least one initiator and optionally further constituents, to an adhesive tape having this water vapor barrier adhesive composition and to the use of such an adhesive composition or such an adhesive tape for sealing of moisture-sensitive (opto)electronic structures, and the adhesive-bonded composite comprising a first substrate, a second substrate and, disposed between them, an adhesive tape having at least one layer of the adhesive composition of the invention in cured form.

BACKGROUND OF THE DISCLOSURE

Encapsulation of moisture-sensitive organic assemblies, for example organic light emitting diodes (OLEDs), is achieved using special barrier adhesive compositions, also described as adhesive compositions having water vapor barrier properties. A good adhesive composition for sealing (opto)electronic structures or arrangements has a low permeability to oxygen and in particular to water vapor, has sufficient adhesion on the assembly and can readily wet out said assembly. Low adhesion on the arrangement reduces the barrier effect at the interface, which enables entry of oxygen and water vapor irrespective of the properties of the adhesive composition. Only when there is contact between composition and substrate throughout are the bulk properties the determining factor for the barrier action of the adhesive composition.

Barrier action is typically characterized by reporting the oxygen transmission rate (OTR) and the water vapor transmission rate (WVTR, test A). The respective rate indicates the area- and time-based flow of oxygen or water vapor through a film under specific conditions of temperature and partial pressure and possibly further measurement conditions such as relative air humidity. The smaller these values, the better the suitability of the respective material for encapsulation. It can be inferred from these prerequisites that nonpolar materials having low WVTR and OTR are particularly suitable for sealing applications, but polar materials, for example poly(meth)acrylates, are not. DE 10 2008 047 964 A1 indicates such differences. The reported permeation is not based solely on the values of WVTR or OTR but always also includes specification of the mean path length of the permeation, for example the thickness of the material, or normalization to a particular path length.

Water vapor barrier adhesive compositions or barrier adhesive compositions currently being used in the prior art for edge encapsulation of sensitive (opto)electronic structures are frequently liquid epoxy adhesives. Options for two-dimensional encapsulation include pressure-sensitive adhesives, adhesive tapes and adhesive films. For this purpose, polymers and tackifying resins are added to the liquid epoxides to make the formulations pressure-sensitive. Tests have shown that barrier performance increases with the proportion of epoxy resin.

Since barrier performance increases with the proportion of epoxy in the adhesive composition, it is thus desirable to achieve high epoxy contents. However, the problem here is that customary epoxides are liquid and hence there is a decrease in the film properties with rising epoxy content and an adverse effect on processing characteristics (for example tendency to be squeezed out of a bonded joint). Current barrier adhesive compositions are therefore limited in their epoxy content. The viscosity of epichlorohydrin-based epoxy resins is typically adjusted via the ratio of epichlorohydrin to, for example, bisphenol-A and a resulting slight increase in molecular weight ["Epoxy Adhesive Formulations" 2006, E. M. Petrie, p. 30ff]. The disadvantage is a high halogen content resulting from the production process which is not tolerated in applications in the electronics industry. The epoxide can be purified by distillation (for example Epikote 828 LVEL), but this only works with distillable (liquid) epoxides, and, owing to the abovementioned resultant disadvantages in terms of processing properties, it is in turn not possible to include high proportions of these in the adhesive composition formulations, especially for adhesive films. Another option is provided by so-called b-staged epoxy systems. These are epoxy systems which have already been subjected to mild incipient crosslinking and are thus no longer liquid. However, the great disadvantage of these systems is that they require refrigerated transport since otherwise the crosslinking reaction progresses and the epoxides undergo complete crosslinking.

The term "squeezing-out" or else "oozing" in the context of this invention is understood to mean lateral escape of the adhesive composition from an uncured or insufficiently cured adhesive layer or adhesive bond. This can occur in the form of cold flow and/or under pressure and/or at elevated temperature and is undesirable.

More specialized epoxy monomers, for example epoxycyclohexyl derivatives, which are not prepared via the epichlorohydrin route are often of very low viscosity. One example thereof is Uvacure 1500.

There is therefore a need for curable epoxides which can be provided in the uncrosslinked state with sufficiently high viscosity, but nevertheless can adapt well under bonding conditions to the substrate surfaces to be bonded, such that contact between barrier adhesive composition and substrate surface can be achieved throughout. With this prerequisite, the curable epoxides being sought or the curable adhesive compositions comprising them should have good water vapor barrier properties and, in combination with their bonding properties, be of good suitability for the sealing of sensitive (opto)electronic structures. The curable epoxides are to be easily preparable.

Among the barrier properties, what is called the lag time is particularly crucial (test B). This property describes the barrier capacity of a sealing layer over that period of time over which the sealing layer keeps moisture away from sensitive functional elements such as, in particular, organic (opto)electronics. What are being sought are water vapor barrier adhesive compositions that have a lag time by test B of at least 150 h, preferably of at least 250 h.

AU 758128 B2 describes storage-stable cationically curing multifunctional epoxy mixtures. To achieve storage stability of the multifunctional epoxy resins it is necessary according to this document to avoid undesired premature polymerization. This is achieved by adding 0.0005 to 10 wt % of an organic and/or inorganic alkaline earth metal or alkali metal compound during the polymerization of multifunctional epoxy monomers. Polymerization before desired crosslinking is thus to be avoided in any event. In addition to the inventive stabilization of these adhesive compositions, it is apparent from this document that epoxycyclohexyl derivatives are particularly preferred for cationically curable liquid adhesives, and so it would be desirable to be able to use this monomer to prepare high-viscosity epoxides.

SG 160949 B proposes reacting diepoxides with diisocyanates. This mixture affords cyclic trimers (isocyanurates) and oxazolidinones having a weight-average molecular weight of less than 3000 g/mol and a low polydispersity, which can then be cured like epoxides. It is necessary to use at least difunctional substances since otherwise no reactive groups are available for the subsequent curing. However, the compounds formed have low viscosities.

Curable epoxy-based adhesive compositions that are used in the form of adhesive tapes are known. They typically contain a film former component, which may be an elastomer, a thermoplastic polymer or a thermoplastic elastomer, and a reactive component frequently consisting of a reactive resin, epoxy-based in this case, and a hardener system (also referred to as activator system or initiator system). Examples are to be found in EP 1 028 151 B1 (poly(meth)acrylate/low molecular weight epoxy resin), EP 620 259 A1 (polyester/low molecular weight epoxy resin), EP 721 975 (polyolefin/low molecular weight epoxy resin) and DE 195 19 499 A1 (thermoplastic polyurethane/low molecular weight epoxy resin).

The term "curable adhesive composition" in the context of this invention is understood to mean a formulation that contains functional groups that can take part in a reaction via the action of a hardener/initiator/activator component and optionally in combination with an additional stimulus such as heat and/or radiation, said reaction leading to an increase in molecular weight and/or crosslinking of at least one formulation constituent.

The terms "hardener", "initiator", "activator" are used synonymously in the context of this invention. They describe substances or substance mixtures that can bring about a curing reaction with involvement of epoxide functionalities, optionally in combination with an additional stimulus such as heat and/or radiation.

Moreover, in the case of curable adhesive compositions that are to be used in the form of adhesive tapes, it is typically necessary to assure sufficient storage stability under storage conditions, such that the adhesive tape can be transported and stored in an uncomplicated manner, before the actual reactivity then occurs/is to occur only in the activation step and under activation conditions. Without such latency, the practicability of said adhesive tapes is limited.

Especially cationically curable epoxy systems are suitable here, and here in particular those based on (cyclo)aliphatic epoxides that react via activation by means of an acid-forming initiator either thermally ("thermal acid generator", TAG) and/or under action of ultraviolet radiation ("photo acid generator", PAG). (Cyclo)aliphatic epoxides can be more efficiently cured with these initiators than glycidyl ethers (J. V. Crivello, *J. Polym. Sci. A Polym. Chem.*, 1999 37, 4241-54). For formulation based on (cyclo)aliphatic epoxides that are particularly suitable for activation of this kind, however, there is by no means such a wealth of different reactive resins available to the person skilled in the art as in the case of glycidyl ether-based reactive resins. The available reactive resins based on (cyclo)aliphatic epoxides are additionally of low molecular weight, which can lead to the problem of squeezing-out under hot compression conditions or even at room temperature, since the as yet unconverted reactive resins of low molecular weight function as plasticizers. What are therefore being sought are reactive resins for adhesive compositions and here especially for adhesive compositions in film form that have the disadvantages described in reduced form, if at all.

WO 98/21287 A1 describes radiation-curable precursors for thermally curable adhesive systems comprising (a) a radiation-curable monomer/prepolymer syrup that should be regarded particularly as a poly(meth)acrylate component, (b) an epoxy resin component, (c) a photoinitiator component and (d) a nucleophilic thermal activator. Oligomeric and polymeric epoxides can be used as component (b). (Co)polymers functionalized with cycloaliphatic epoxides are not mentioned explicitly. Cycloaliphatic epoxides are even fundamentally described as being not very advantageous; see page 19 line 2 of the document in question. Curing by means of TAGs or PAGs is not envisaged. Uses in the field of sealing of sensitive (opto)electronic structures are not envisaged.

U.S. Pat. No. 4,552,604 A is a further example of a "dual-cure" system in which a poly(meth)acrylate is formed by photopolymerization in the presence of an epoxy resin. The photopolymerization of the liquid composition is effected on a liner. The photopolymerized film is finally made to cure thermally for the bonding. The photopolymerization is utilized in order to form a polymeric matrix for the thermally curable epoxy component. There is no mention of curing with superacid-forming initiators. Uses in the field of sealing of sensitive (opto)electronic structures are not envisaged.

EP 2 545 132 A1 discloses a photocurable pressure-sensitive adhesive based on a polyacrylate. The polyacrylate contains a small proportion of an epoxy-functionalized comonomer via which crosslinking of the pressure-sensitive adhesive is possible. The proportion of epoxy-functionalized comonomer is very small, and so it is not possible to use the copolymers described directly to obtain reactive adhesive tapes with bond strengths well above those of the pressure-sensitive adhesive compositions. Uses in the field of sealing of sensitive (opto)electronic structures are not envisaged.

EP 819 746 A1 describes curable adhesive films, the formulation of which comprises a polyacrylate of high molecular weight, a photopolymerizable epoxy component and a cationic photoinitiator. According to the description, the polyacrylate may likewise contain small proportions, for example about 2% of the copolymer, of epoxy groups. No specific selection is made with regard to the epoxy component. Uses in the field of sealing of sensitive (opto)electronic structures are not envisaged.

EP 914 027 A1 likewise describes curable adhesive films that may contain a polyacrylate, an epoxy component and a latent hardener. The polyacrylate may contain small proportions of glycidyl (meth)acrylate. Uses in the field of sealing of sensitive (opto)electronic structures are not envisaged.

WO 2013/101693 A1 discloses thermally curable adhesive films produced from an acrylate monomer mixture which is free-radically polymerized by means of photoinitiation, and an epoxy component. There is no mention of epoxy-functionalized (meth)acrylate monomers. Uses in the field of sealing of sensitive (opto)electronic structures are not envisaged.

WO 2015/048012 A1 describes a thermally curable pressure-sensitive adhesive system comprising a polymethacrylate component that can react with benzoxazines. For this purpose it may contain epoxy groups inter alia, preferably introduced into the polymer via glycidyl methacrylate as comonomer. The description includes glass transition temperatures that are calculated via the Fox equation (U. W. Gedde, Polymer Physics, 1999, Kluwer, Dordrecht, p. 70). The Fox equation permits a theoretical estimate of the glass transition temperature of a homogeneous mixture and for the purpose utilizes the glass transition temperatures of the starting components of the mixture weighted by the respective proportion of these components in the mixture. The base data used therein are based on glass transition temperatures for hypothetical homopolymers of the corresponding comonomer. For this purpose, it is possible to use tabular values that are listed for homopolymers having very high molar masses, namely those in which there is no longer any change in glass transition temperature with molecular weight. Said Fox equation should not be confused with the Fox-Flory relationship (equation G1) that describes the effect of the molar polymer mass on glass transition temperature. In the case of the polymers described in WO 2015/048012 A1, very high molecular weights can therefore be assumed, and the utilization of polymers with lower molecular weight was apparently not considered. Uses in the field of sealing of sensitive (opto)electronic structures are not envisaged.

WO 1999/057216 A1 discloses formulations comprising ethylene-vinyl acetate copolymers and an epoxy component that can also be a polymer. A specific example cited is a polymer containing glycidyl methacrylate. There is no mention of polymers of (cyclo)aliphatic epoxy-substituted (meth)acrylates. Uses in the field of sealing of sensitive (opto)electronic structures are not envisaged.

WO 2012/165259 A1 describes polymerizable liquid adhesive formulations that are made to cure by UV radiation. For this purpose, the formulations contain monomers that bear cycloaliphatic epoxy groups and (meth)acrylate groups. The formulations additionally contain firstly photoinitiators for the free-radical polymerization of the (meth)acrylate groups and secondly photoinitiators for the cationic polymerization of the epoxy groups. Irradiation then simultaneously initiates both reaction processes. The formulations have the disadvantages that are typical of liquid adhesive systems, such as odor and a tendency to be squeezed out on application. Moreover, the free-radical curing operation can be disadvantageous since this type of curing proceeds only during irradiation and the curing reaction via this mechanism does not reach adhesive in shadow regions. Uses in the field of sealing of sensitive (opto)electronic structures are not envisaged.

US 2010/0137530 A1 discloses epoxy adhesive compositions containing one epoxy resin of low molecular weight and one of high molecular weight. The epoxy resins are oligomers of glycidyl ethers. Use as sealing compound for OLEDs is proposed for the adhesive composition. However, a disadvantage in these systems is typically the halogen content and the associated need for complex processes for elimination thereof for applications in the electronics sector for example.

BRIEF SUMMARY OF THE DISCLOSURE

It has now been found that adhesive compositions comprising a (co)poly(meth)acrylate that has been functionalized with epoxy groups, especially (cyclo)aliphatic epoxy groups, are of very good suitability for the stated object. This is surprising since the barrier effect required was not to be expected owing to the polarity of the poly(meth)acrylate backbone of this type of base (co)polymer.

DETAILED DESCRIPTION OF THE DISCLOSURE

The invention accordingly relates to curable adhesive compositions for the sealing of (opto)electronic components consisting of the following components:
- (A) 20% to 99.9% by weight (based on the entirety of the curable adhesive composition) of a (co)polymer functionalized with epoxy groups and having a weight-average molar mass in the range from 5000 g/mol to 20,000 g/mol, based on more than 30% to 100% by weight, preferably 50% to 100% by weight, (based on the entirety of the parent monomers of the epoxy-functionalized (co)polymer) of at least one type of (meth)acrylic (co)monomer (a) functionalized with an epoxy group,
- (B) 0.1% to 5% by weight (based on the entirety of the curable adhesive composition) of at least one curing agent that can induce the curing—especially cationic curing—of the (co)polymer (A) with reaction of its epoxy groups by thermal means and/or by supply of UV radiation,
- (C) optionally 0% to 79.9% by weight of further constituents.

The molar mass figures relate to measurement by means of GPC by test method C.

In the context of this invention, the term "(co)polymer" is used collectively for homopolymers or copolymers. Where polymers are mentioned in the context of the document, this means (co)polymers unless otherwise apparent from the respective context.

The term "(co)poly(meth)acrylate" in the context of this invention is understood to mean polyacrylate and polymethacrylate homopolymers or copolymers composed of (meth)acrylic monomers and any other copolymerizable comonomers.

The term "(meth)acrylates" and the adjective "(meth)acrylic" refer collectively to the compounds from the group of acrylic acid derivatives—such as acrylic esters in particular—and methacrylates—such as methacrylic esters in particular.

In the context of this invention, "(co)polymerizable" relates to the ability of one type of monomer or of a mixture of at least two types of monomer to form a (co)polymer by molecular weight-increasing reaction.

In a preferred manner, the weight-average molar mass of the epoxy-functionalized (co)polymer (A) is at least 10 000 g/mol, very preferably at least 20 000 g/mol. Further preferably, the weight-average molar mass of the epoxy-functionalized (co)polymer (A) is at most 150 000 g/mol, very preferably at most 100 000 g/mol.

In accordance with the proportion in the entirety of the parent monomers of the epoxy-functionalized (co)polymer, the (meth)acrylic (co)monomers (a) functionalized with an epoxy group have a (co)monomer content in the epoxy-functionalized (co)polymer of more than 30% by weight to 100% by weight, preferably of at least 50% by weight.

In a very preferred manner, the (meth)acrylic (co)monomer (a) functionalized with an epoxy group used is a cycloaliphatic epoxide, or, when two or more (meth)acrylic (co)monomers (a) functionalized with an epoxy group are present, cycloaliphatic epoxides are used for one, more than one or all these (meth)acrylic (co)monomers (a) functionalized with an epoxy group. Especially advantageously, cycloaliphatic epoxides are used for more than 50% by weight of the (co)monomers (a); more preferably, exclusively cycloaliphatic epoxides are used for the (co)monomers (a).

The at least one type of functionalized (co)polymer may optionally comprise units derivable from the following monomers (in which case at least a copolymer is present), where each of the monomer types (b), (c) and (d) mentioned hereinafter may be present irrespective of the presence of the respective other types of monomer:

(b) one or more types of comonomer having a glass transition temperature of at least 25° C., especially at least 50° C., with a comonomer content in the copolymer of 0% by weight to less than 70% by weight, preferably to at most 50% by weight, and/or (c) one or more types of comonomer having a glass transition temperature of below 25° C., especially at most 0° C., with a comonomer content in the copolymer of 0% by weight to less than 70% by weight, preferably to at most 50% by weight, and/or (d) one or more types of comonomer that bear at least one functionality other than an epoxy group, especially a silicon-containing group, with a comonomer content in the copolymer of 0% by weight to 10% by weight, preferably to 5% by weight.

Monomer content or (co)monomer content in the (co)polymer in the context of this document refers to the proportion of the repeat units (building blocks) attributable to these (co)monomers in the polymer in question.

The monomer contents in the polymer mixture to be polymerized for the preparation of the corresponding copolymer are advantageously chosen accordingly.

Glass transition temperature figures in this document relate to measurement by means of DSC by method D1.

The proportion of the functionalized (co)polymer (A) in the curable adhesive composition is at least 20% by weight, preferably at least 50% by weight, very preferably at least 70% by weight. It may even be up to 99.9% by weight of the adhesive composition.

The glass transition temperature of the uncured functionalized (co)polymer (A) is preferably at least 0° C., very preferably at least 25° C. or even at least 35° C. It is at most 100° C. and preferably at most 80° C. In an alternative execution of the invention, the glass transition temperature of the functionalized (co)polymer (A) may also be below 0° C.

The proportion of the at least one curing agent (B) in the adhesive composition is at least 0.1% by weight up to preferably at most 5% by weight. A very preferred amount is at least 0.3% by weight to 3% by weight, based on the overall formulation of the curable adhesive composition.

The proportion of further optional constituents (C), if they are used and according to the nature of the constituent, is at most 79.9% by weight, especially at most 69.9% by weight, preferably at most 49.9% by weight, very preferably at most 29.9% by weight, based on the overall formulation of the curable adhesive composition.

In a preferred manner, the curable adhesive composition in the uncured state has a first glass transition temperature below that temperature at which the adhesive bond consisting of reactive adhesive film and substrates to be bonded is created by lamination, such that the formulation under lamination conditions under pressure permits sufficient wetting on the substrate(s) within a defined period of time. In the context of this invention, the temperature utilized for the lamination is called "lamination temperature". The temperature difference between the lamination temperature and glass transition temperature is preferably at least about 40° C., especially at least about 70° C. or even at least 100° C., the lamination temperature being above the glass transition temperature. The lamination temperature is advantageously between 40° C. and 100° C., especially between 50° C. and 80° C. It is below the activation temperature, i.e. that temperature at which the curing of the curable adhesive composition is initiated if the adhesive composition is a thermally activatable adhesive composition. The difference between lamination temperature and activation temperature in this case is advantageously at least 20° C., especially at least 40° C.

The glass transition temperature for the cured adhesive composition, by contrast, is very preferably at least 40° C. higher, especially at least 100° C. higher, than for the uncured adhesive system. By virtue of the high number of reactive groups in the (co)polymer (A) and possibly in further constituents (C), it may be possible for a glass transition temperature in the cured state to be undeterminable, or above the breakdown temperature, owing to the high degree of crosslinking.

Further advantageously, the glass transition temperature for the cured (co)polymer (A) itself is at least 40° C. higher, especially at least 100° C. higher, than for the uncured (co)polymer. By virtue of the high number of reactive groups in the (co)polymer (A), it may be possible for a glass transition temperature in the cured state to be undeterminable, or above the breakdown temperature, owing to the high degree of crosslinking.

In the context of this invention, entitlement as "cured system" or "cured adhesive composition" means that the adhesive composition with the functionalized (co)polymer (A) has been activated via action of the curing agent component and optionally a further stimulus such as heat and/or radiation, and a reaction involving the functional groups of the (co)polymer (A) has taken place. However, there is no need for all functional groups chemically involved in the curing reaction to have reacted. Instead, a conversion of 50% of the functional groups may already bring a sufficiently high glass transition temperature and be of very good suitability for the sealing application. A conversion of 50% is mentioned here by way of example. The statement made may also apply to higher conversions such as 60%, 70%, 80% or 90%, or even lower conversions such as 40% or 30%. What is crucial is that the barrier properties are in accordance with the application after curing has been conducted, meaning that the lag time by test B is at least 150 h.

The adhesive composition may be pressure-sensitively adhesive under standard conditions (23° C., 50% rel. air humidity). In that case, it has a glass transition temperature in the uncured state below 0° C., preferably of at most −25° C. These characteristics simplify finishing processes such as the preliminary dimensioning of adhesive tape sections for the later bonding process or else lamination steps in the production of adhesive product constructions and component bonding. In the lamination process, it is not absolutely necessary in this case to work at elevated temperature; instead, lamination is possible at room temperature since sufficient contact between adhesive composition and the substrates to be bonded can already be achieved via the lamination pressure. UV radiation is an excellent option for curing in this case. However, thermal activation is also possible. "Pressure-sensitive adhesive compositions" (PSAs) are understood, as usual, to mean those viscoelastic polymeric materials which—optionally via suitable additization with further components, for example tackifying resins—have lasting tackiness and permanent adhesiveness at the use temperature (unless defined otherwise, at room temperature, i.e. 23° C.) and adhere on contact to a multitude of surfaces and especially stick immediately (have what is called "tack"). They are capable, even at the use temperature, without activation by solvent or by heat—optionally under the influence of a greater or lesser pressure—of sufficiently wetting a substrate to be bonded such that sufficient interactions for adhesion can form between the composition and the substrate.

The adhesive composition may alternatively have only low or zero pressure-sensitive adhesion under standard conditions (23° C., 50% rel. air humidity). In order to establish this, it then has a glass transition temperature in the uncured state of typically at least 0° C., preferably at least 25° C. This characteristic permits advantageous positioning of the adhesive products in the bonding process and no premature sticking to a surface in the wrong position. Furthermore, this characteristic is found to be advantageous for latently reactive adhesive systems since any reactivity in the vitreous/viscoelastic state is significantly (kinetically) lowered and improved latency is achieved thereby. For the lamination process, in that case, not only pressure but also an elevated temperature is required.

On application, especially lamination with heating and compression, the adhesive system softens, its wetting characteristics increase, and it can thus form contact with the substrates to be bonded. In this connection, the molar mass of the inventive functionalized (co)polymer (A) is of central significance, since, for a given composition, it affects the viscoelastic properties of the melt and here especially the melt viscosity. The higher the molar mass, the more marked the effect of entanglements as temporary crosslinking points on the viscoelastic characteristics. If the molar mass of the inventive functionalized (co)polymer (A) is below its entangled molecular weight, corresponding adhesive compositions comprising these (co)polymers are very free-flowing under compression conditions, i.e. above the glass transition temperature, and harbor the risk of significant squeezing-out. If the molar mass, by contrast, is too high, namely within the molar mass range in which the glass transition temperature no longer changes with molar mass, the polymer is already too significantly entangled, which reduces the flow characteristics, and so good adaptation of the adhesive composition is no longer assured under compression conditions.

The inventive functionalized (co)polymer (A) additionally offers a further advantage. This is because the invention makes use of the finding that a reactive system, in the bonding step in which squeezing-out can occur, undergoes an increase in molecular weight through activation of the curing reaction. Two processes take place here: chain growth and crosslinking. Both processes are kinetically controlled and require time. If heat is used under bonding conditions, the viscosity of the system is reduced in accordance with its temperature dependence, which can lead to squeezing-out. If the molecular weight is not increased rapidly enough, as a result of the molar mass dependence of the viscosity, which in principle counteracts the temperature dependence of viscosity, it cannot compensate for the drop in viscosity caused by introduction of heat. The consequence is unwanted squeezing-out of adhesive material and an imperfect bonding result.

However, inventive (co)polymers (A) already have a base molar mass, and so at least a first step of the chain growth already proceeds prior to the activation, and only crosslinking needs to proceed to build up cohesion. A further increase in molar mass does of course also proceed after the activation and, together with the crosslinking, leads to advantageous moisture barrier properties.

The individual constituents of adhesive compositions of the invention are described more specifically hereinafter, although the enumerations should be regarded as examples.

(Co)polymers (A)

According to the invention, reactive (co)polymers selected have a molar mass that is not too low and is at least 5000 g/mol, preferably at least 10 000 g/mol, very preferably at least 20 000 g/mol. This minimum molar mass is important in order that the (co)polymers do not lead to pronounced flowability of the adhesive composition. Additionally very advantageous are (co)polymers that have not too high a molar mass, preferably at most 200 000 g/mol, further preferably at most 150 000 g/mol, very preferably at most 100 000 g/mol. The preferred maximum molar mass offers advantages in the bonding process. (Co)polymers having excessively high molar mass have reduced adaptation characteristics to the substrates to be bonded in the bonding process. Preferably, therefore, (co)polymers are selected from the same molar mass range in which the glass transition temperature of the uncured reactive (co)polymer depends on the molar mass. The dependence between polymer molar mass, M, and glass transition temperature, $T_G$, is known per se and is described as an approximation by the Fox-Flory relationship:

$$1/T_G = 1/T_G^\infty + \text{const}/M \tag{G1}$$

where $T_G^\infty$ is the glass transition temperature of a polymer at which $T_G$ ceases to change with molar mass, and const is a polymer type-dependent constant (T. Fox, P. J. Flory, *J. Polym. Sci.*, 1954, 14, 315-319). This is because it has been found that reactive (co)polymers in their uncured state, within this molar mass range, have excellent viscoelastic characteristics for a compression process/lamination process, specifically a particularly advantageous balance of adaptation capacity and squeezing-out characteristics, particularly in the case that the compression temperature is above the glass transition temperature. A further advantage of adhesive compositions comprising such (co)polymers is the dimensional stability of adhesive layers based thereon.

(Co)monomers (a)

Monomers used for the (co)monomers (a) are those of the formula (I)

(I)

where —$R^1$ is —H or —$CH_3$, —X— is —N($R^3$)— or —O—, —$R^3$ is —H or —$CH_3$ and —$R^2$ is an epoxy-functionalized (hetero)hydrocarbyl group.

Further preferably, the $R^2$ group includes linear, branched, cyclic or polycyclic hydrocarbyl radicals which have 2 to 30 carbon atoms and have been functionalized with an epoxy group. Particularly preferred representatives of this group are 3,4-epoxycyclohexyl-substituted monomers, for example 3,4-epoxycyclohexylmethyl methacrylate, 3,4-epoxycyclohexylmethyl acrylate, 3,4-epoxycyclohexyl methacrylate, 3,4-epoxycyclohexyl acrylate.

Less preferred (co)monomers (a) that are nevertheless encompassed by the invention are (co)monomers containing glycidyl groups, such as glycidyl acrylate or glycidyl methacrylate. However, the curing properties of the oxirane units in glycidyl groups differ from those of (cyclo)aliphatic epoxides especially in the case of cationic curing. Moreover, glycidyl ether-based systems usually contain residual halogen for reasons relating to the processes by which they are prepared. However, the adhesive compositions of the invention preferably have a very low halogen content (<1000 ppm, preferably even <100 ppm), especially based on chlorine and bromine.

The proportion of (co)monomers (a) in the (co)polymers (A) can be used to adjust not only the barrier properties but also mechanical properties of the adhesive composition, since the proportion of epoxy groups in the (co)polymer (A) during the curing can be used to adjust the crosslinking density. Low proportions of (co)monomer (a) lead to less elastic adhesive layers, higher proportions to more marked elastic adhesive layers, each with respect to the viscoelastic properties.

Comonomers (b)

Comonomers (b) especially have no epoxy groups. Usable comonomers within the scope of comonomers (b) are all (meth)acrylate monomers known to the person skilled in the art—especially those that are free of epoxy groups—and other copolymerizable vinyl monomers that are copolymerizable with (co)monomers (a) and any comonomers (c) and/or (d) present and that have a glass transition temperature as hypothetical homopolymer (in this connection, this means the glass transition temperature of the homopolymer of the corresponding monomers within the molar mass-independent glass transition temperature range, $T_G^\infty$) of at least 25° C., especially at least 50° C. Monomers of this kind are also referred to as "hard monomers" in the context of this document. An example of a source that can be consulted for selection of such comonomers is the Polymer Handbook (J. Brandrup, E. H. Immergut, E. A. Grulke (eds.), 4th ed., 1999, J. Wiley, Hoboken, vol. 1, chapter VI/193). Also advantageously usable are what are called macromers according to WO 2015/082143 A1. Preference is given to comonomers which essentially, by virtue of their chemical design, prior to the initiation of the curing reaction, have no reactivity with the epoxy functionalities of the (co)monomers (a) or have an initiating or catalyzing effect in relation to a reaction of the epoxy functionalities, or their reactivity with epoxy functionalities is otherwise suppressed.

The proportion of comonomers (b) can be used to adjust the adhesive and mechanical properties of the adhesive composition. They have a tendency to make the adhesive composition harder.

Comonomers (c)

Comonomers (c) especially have no epoxy groups. Usable comonomers within the scope of comonomers (c) are all (meth)acrylate monomers known to the person skilled in the art—especially those that are free of epoxy groups—and other copolymerizable vinyl monomers that are copolymerizable with (co)monomers (a) and any comonomers (b) and/or (d) present and that have a glass transition temperature as hypothetical homopolymer (in this connection, this means the glass transition temperature of the homopolymer of the corresponding monomers within the molar mass-independent glass transition temperature range, $T_G^\infty$) of below 25° C., especially at most 0° C. Monomers of this kind are also referred to as "soft monomers" in the context of this document. An example of a source that can be consulted for selection of such comonomers for this purpose too is the Polymer Handbook (J. Brandrup, E. H. Immergut, E. A. Grulke (eds.), 4th ed., 1999, J. Wiley, Hoboken, vol. 1, chapter VI/193). Also advantageously usable are what are called macromers according to WO 2015/082143 A1. Preference is given to comonomers which, by virtue of their chemical design, prior to the initiation of the curing reaction, essentially have no reactivity with the epoxy functionalities of the (co)monomers (a) or have an initiating or catalyzing effect in relation to a reaction of the epoxy functionalities, or their reactivity with epoxy functionalities is otherwise suppressed.

The proportion of comonomers (c) can be used to adjust the adhesive and mechanical properties of the adhesive composition. They have a tendency to make the adhesive composition softer, and pressure-sensitive adhesiveness can be achieved.

Comonomers (d)

Monomers used within the scope of the comonomers (d) are those that are copolymerizable with (co)monomers (a) and any comonomers (b) and/or (c) present and that optimize the adhesive properties of the copolymer of the invention. In this connection, in particular, silicon-containing comonomers and here of acrylated or methacrylated alkoxysilane-containing comonomers should be mentioned as being advantageous. Examples are 3-(triethoxysilyl) propyl methacrylate, 3-(triethoxysilyl)propyl acrylate, 3-(trimethoxysilyl)propyl acrylate, 3-(trimethoxysilyl)propyl methacrylate, methacryloyloxymethyltriethoxysilane, (methacryloyloxymethyl)trimethoxysilane, (3-acryloyloxypropyl)methyldimethoxysilane, (methacryloyloxymethyl)methyldimethoxysilane, γ-methacryloyloxypropylmethyldimethoxysilane, methacryloyloxypropylmethyldiethoxysilane, 3-(dimethoxmethylsilyl)propyl methacrylate, methacryloyloxypropyldimethylethoxysilane, methacryloyloxypropyldimethylmethoxysilane. Among the aforementioned compounds, particular preference is given to 3-(triethoxysilyl)propyl methacrylate, 3-(triethoxysilyl)propyl acrylate, 3-(trimethoxysilyl)propyl acrylate and 3-(trimethoxysilyl) propyl methacrylate.

The comonomers (d) also preferably have no epoxy groups.

Preparation

The preparation of the (co)polymers (A) is effected by (co)polymerization of the parent (co)monomers and can be conducted in substance, in the presence of one or more organic solvents, in the presence of water or in mixtures of organic solvents and water. The aim here is to keep the amount of solvent used as small as possible. Suitable organic solvents are pure alkanes (for example hexane, heptane, octane, isooctane, isohexane, cyclohexane), aromatic hydrocarbons (for example benzene, toluene, xylene), esters (for example ethyl acetate, propyl, butyl or hexyl acetate), halogenated hydrocarbons (for example chlorobenzene), alkanols (for example methanol, ethanol, ethylene glycol, ethylene glycol monomethyl ether), ketones (for example acetone, butanone) and ethers (for example diethyl ether, dibutyl ether) or mixtures thereof. Compounds that can react with epoxy functionalities prior to the initiation of the curing reaction or can initiate or catalyze the reaction of epoxy functionalities, or their reactivity with epoxy functionalities is not suppressed in some other way, are avoided.

The aqueous polymerization reactions can be admixed with a water-miscible or hydrophilic cosolvent in order to ensure that the reaction mixture is in the form of a homogeneous phase during the monomer conversion. Advantageously usable cosolvents for the present invention are chosen from the following group consisting of aliphatic alcohols, glycols, ethers, glycol ethers, polyethylene glycols, polypropylene glycols, esters, alcohol derivatives, hydroxy ether derivatives, ketones and the like, and derivatives and mixtures thereof. Compounds that can react with epoxy functionalities and/or can initiate or catalyze the reaction of epoxy functionalities and/or whose reactivity with epoxy functionalities is not suppressed in some other way are avoided.

The functionalized (co)polymers of the invention are advantageously prepared using conventional free-radical polymerizations or controlled free-radical polymerizations. For the free-radical polymerizations, preference is given to using initiator systems that additionally contain further free-radical initiators for polymerization (polymerization initiators), especially free-radical-forming azo or peroxo initiators that undergo thermal breakdown. However, all polymerization initiators that are customary for acrylates and/or methacrylates and are familiar to the person skilled in the art are suitable in principle. The production of C-centered radicals is described in Houben-Weyl, Methoden der Organischen Chemie, Vol. E 19a, p. 60-147. These methods are preferably employed analogously.

The free-radical polymerization initiators mentioned in connection with the preparation of the (co)polymers (A) should not be confused with the hardeners or activators used for the curing of the curable adhesive composition.

Examples of free-radical sources are peroxides, hydroperoxides and azo compounds. A few nonexclusive examples of typical free-radical initiators include potassium peroxodisulfate, dibenzoyl peroxide, cumene hydroperoxide, cyclohexanone peroxide, di-tert-butyl peroxide, azobisisobutyronitrile, cyclohexylsulfonyl acetyl peroxide, diisopropyl percarbonate, tert-butyl peroctoate, benzpinacol. Particular preference is given to using 2,2'-azobis(2-methylbutyronitrile) or 2,2-azobis(2,4-dimethylvaleronitrile) as free-radical polymerization initiator.

The polymerization time is—according to temperature and desired conversion—between 4 and 72 hours. The higher the reaction temperature that can be chosen, i.e. the higher the thermal stability of the reaction mixture, the shorter the reaction time that can be chosen.

For initiation of the polymerization, the input of heat is essential for the polymerization initiators that undergo thermal breakdown. For the polymerization initiators that undergo thermal breakdown, the polymerization can be initiated by heating to 50° C. or more, according to the initiator type. Preference is given to an initiation temperature of not more than 100° C., very preferably of not more than 80° C.

Free radicals are stabilized, in a favorable procedure, using nitroxides, for example (2,2,5,5-tetramethyl-1-pyrrolidinyl)oxyl (PROXYL), (2,2,6,6-tetramethyl-1-piperidinyl)oxyl (TEMPO), derivatives of PROXYL or of TEMPO and further nitroxides familiar to the person skilled in the art.

A number of further polymerization methods by which the adhesive compositions can be prepared in an alternative procedure can be chosen from the prior art: WO 96/24620 A1 describes a polymerization process in which very specific free-radical compounds, for example phosphorus-containing nitroxides based on imidazolidine, are used. WO 98/44008 A1 discloses specific nitroxyls based on morpholines, piperazinones and piperazinediones. DE 199 49 352 A1 describes heterocyclic alkoxy amines as regulators in controlled free-radical polymerizations.

A further controlled polymerization method that can be used is atom transfer radical polymerization (ATRP), wherein the polymerization initiators used are preferably monofunctional or difunctional secondary or tertiary halides, and the halide(s) is/are abstracted using complexes of Cu, Ni, Fe, Pd, Pt, Ru, Os, Rh, Co, Ir, Ag or Au. The different options for ATRP are also described in the documents U.S. Pat. Nos. 5,945,491 A, 5,854,364 A and 5,789,487 A.

A further preparation process conducted is a variant of RAFT polymerization (reversible addition-fragmentation chain transfer polymerization). The polymerization process is described in detail, for example, in documents WO 98/01478 A1 and WO 99/31144 A1. Particularly advantageous for the preparation are trithiocarbonates of the general structure R'''—S—C(S)—S—R''' (*Macromolecules*, 2000, 33, 243-245).

In a very advantageous variant, for example, the trithiocarbonates (TTC1) and (TTC2) or the thio compounds (THI1) and (THI2) are used for polymerization, where φ is a phenyl ring which may be unfunctionalized or functionalized by alkyl or aryl substituents bonded directly or via ester or ether bridges, a cyano group or a saturated or unsaturated aliphatic radical. The phenyl ring D may optionally bear one or more polymer blocks, for example polybutadiene, polyisoprene or polystyrene, to name just a few. Functionalizations may, for example, be halogens, hydroxyl groups, epoxy groups, although this list does not make any claim to completeness.

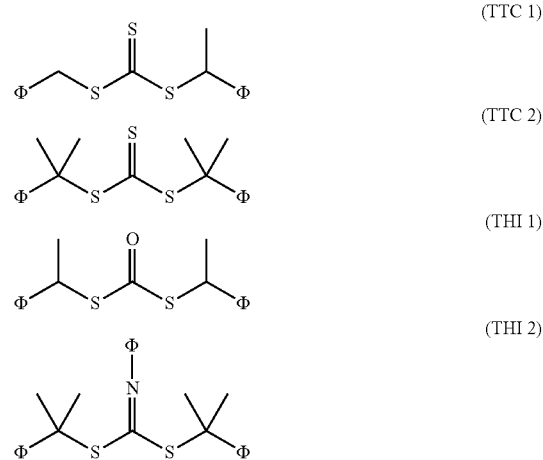

In conjunction with the abovementioned controlled free-radical polymerizations, preference is given to polymerization initiator systems that additionally contain further free-radical polymerization initiators, especially the free-radical-forming azo or peroxo initiators that undergo thermal breakdown and have already been enumerated above. However, all customary polymerization initiators that are known for acrylates and/or methacrylates are suitable in principle for this purpose. In addition, it is also possible to use free-radical sources that only release free radicals under UV irradiation. It is crucial that these polymerization initiators cannot activate any reaction of the epoxy functionalities.

The purpose of molar mass adjustment can also be accomplished using chain transfer reagents according to the prior art, provided that they do not have any reactivity toward epoxy groups or their reactivity with epoxy groups has been suppressed in some other way.

The desired molar mass is preferably established by polymerization methods, whether they be controlled polymerization methods or uncontrolled polymerization methods, in which no agents that can react with epoxy functionalities prior to the initiation of the curing reaction of the adhesive film or that can initiate or catalyze reaction of epoxy functionalities, or their reactivity with epoxy groups has been suppressed in some other way, are used.

The establishment of the desired molar mass can additionally and more preferably be achieved via the use ratio of polymerization initiators and (co)monomer(s) and/or the concentration of (co)monomers.

Curing Agent (B)

Adhesive compositions of the invention contain at least one type of curing agent. The curing agents are selected such that the resulting formulation has latency in its reactivity. This means that the adhesive system or the adhesive film based thereon, under particular conditions, for example at room temperature or even slightly elevated temperatures such as 35° C. or even 50° C. and/or with exclusion of light, shows essentially no reaction or even no reaction at all. The reaction follows an activation impulse that can be triggered by elevated temperature and/or light (especially UV radiation). In the context of this invention, latency for thermally curable adhesive compositions is defined via the activation temperature that can be determined by means of a DSC experiment (test D2). The activation temperature thus determined for curing agents of the invention is at least 60° C., preferably at least 70° C., very preferably at least 90° C. It is at most 120° C., preferably at most 100° C. For UV-curable adhesive compositions, latency is typically very good. However, exclusion of light should be ensured until the time of activation. Examples of curing agents that are particularly suitable in this context include thermally activatable acid formers, TAGs. The effect of heat results in release of a strong acid, called the superacid, from the initiator substance, and this acid can bring about ring opening of the epoxy groups. Thermally activatable curing agents that are usable in the context of the present invention for cationic curing of epoxy groups are especially pyridinium salts, ammonium salts (especially anilinium salts) and sulfonium salts (especially thiolanium salts), and lanthanoid triflates.

N-Benzylpyridinium salts and benzylpyridinium salts are very advantageous, where aromatic systems may be substituted, for example, by alkyl, alkoxy, halogen or cyano groups.

*J. Polym. Sci. A,* 1995, 33, 505ff, US 2014/0367670 A1, U.S. Pat. No. 5,242,715, *J. Polym. Sci. B,* 2001, 39, 2397ff, EP 393893 A1, *Macromolecules,* 1990, 23, 431ff, *Macromolecules,* 1991, 24, 2689, *Macromol. Chem. Phys.,* 2001, 202, 2554ff, WO 2013/156509 A2 and JP 2014/062057 A1 name corresponding compounds usable in the context of this invention.

Of the commercially available curing agent systems, examples of compounds that are usable very advantageously include San-Aid SI 80 L, San-Aid SI 100 L, San-Aid SI 110 L, San-Aid SI B2A, San-Aid SI B3, San-Aid SI B3A and San-Aid SI B4 from Sanshin, Opton CP-66 and Opton CP-77 from Adeka, and K-Pure TAG 2678, K-Pure CXC 1612 and K-Pure CXC 1614 from King Industries.

Lanthanoid triflates are additionally usable, such as samarium(III) triflate, ytterbium(III) triflate, erbium(III) triflate or dysprosium(III) triflate (available from Sigma Aldrich), and lanthanum(III) triflate (available from Alfa Aesar).

Examples of anions which serve as counterions for the abovementioned cations include tetrafluoroborate, tetraphenylborate, hexafluorophosphate, perchlorate, tetrachloroferrate, hexafluoroarsenate, hexafluoroantimonate, pentafluorohydroxyantimonate, hexachloroantimonate, tetrakispentafluorophenylborate, tetrakis(pentafluoromethylphenyl)borate, bi(trifluoromethylsulfonyl)amide and tris(trifluoromethylsulfonyl)methide. Additionally usable are anions according to JP 2012-056915 A1 and EP 393893 A1. Curing agents that are essentially free of chlorine and bromine are preferred. The anion is preferably arsenic- and antimony-free.

The person skilled in the art is aware of further systems that are likewise usable in accordance with the invention. Latently reactive thermally activatable curing agents for cationic curing are used in uncombined form or as combinations of two or more thermally activatable curing agents.

Compared to photoinitiators and photoinitiatable curing systems, thermally activatable initiators and curing systems have the advantages that the adhesive tape is more easily transportable and processable. There is no need to ensure exclusion of light.

Advantageous latently reactive thermally activatable curing agents in the context of the present invention are those that have an activation temperature of at least 60° C., preferably of at least 70° C. and at most 120° C., at which cationic curing of the functionalized (co)polymers can be initiated. Advantageous activation/curing temperatures are also 80° C. and 100° C. Curing/initiation within these temperature ranges is preferred in order not to thermally damage thermally sensitive (opto)electronic structures. The curing time may be 15 min or more or 2 h or less, although distinctly shorter (such as 10 s, 30 s, 60 s, 120 s, 240 s, 5 min or 10 min) or even longer curing times are not ruled out.

Very preferred in combination with the functionalized (co)polymer of the invention are additionally acid formers activatable by means of (UV) radiation, PAGs. These can bring about a cationic curing reaction of the epoxy groups via UV initiation.

Among the curing agents for cationic UV curing, sulfonium-, iodonium- and metallocene-based systems in particular are usable.

For examples of sulfonium-based cations, reference is made to the details given in U.S. Pat. No. 6,908,722 B1 (especially columns 10 to 21).

Examples of anions which serve as counterions for the abovementioned cations include tetrafluoroborate, tetraphenylborate, hexafluorophosphate, perchlorate, tetrachloroferrate, hexafluoroarsenate, hexafluoroantimonate, pentafluorohydroxyantimonate, hexachloroantimonate, tetrakispentafluorophenylborate, tetrakis(pentafluoromethylphenyl)borate, bi(trifluoromethylsulfonyl)amide and tris(trifluoromethylsulfonyl)methide. Further anions conceivable, especially for iodonium-based curing agents, are also chloride, bromide or iodide. Additionally usable are anions according to JP 2012-056915 A1 and EP 393893 A1. Curing agents that are essentially free of chlorine and bromine are preferred. Here too, the anion is preferably arsenic- and antimony-free.

More specifically, the usable systems include
  sulfonium salts (see for example U.S. Pat. Nos. 4,231,951 A, 4,256,828 A, 4,058,401 A, 4,138,255 A and US 2010/063221 A1) such as triphenylsulfonium hexafluoroarsenate, triphenylsulfonium hexafluoroborate, triphenylsulfonium tetrafluoroborate, triphenylsulfonium tetrakis(pentafluorobenzyl)borate, methyldiphenylsulfonium tetrafluoroborate, methyldiphenylsulfonium tetrakis(pentafluorobenzyl)borate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-butoxyphenyldiphenylsulfonium tetrakis(pentafluorobenzyl)borate, 4-chlorophenyldiphenylsulfonium hexafluoroantimonate, tris(4-phenoxyphenyl)sulfonium hexafluorophosphate, di(4-ethoxyphenyl)methylsulfonium hexafluoroarsenate, 4-acetylphenyldiphenylsulfonium tetrafluoroborate, 4-acetylphenyldiphenylsulfonium tetrakis(pentafluorobenzyl)borate, tris(4-thiomethoxyphenyl)sulfonium hexafluorophosphate, di(methoxysulfonylphenyl)methylsulfonium hexafluoroantimonate, di(methoxynaphthyl)methylsulfonium tetrafluoroborate, di(methoxynaphthyl)methylsulfonium tetrakis(pentafluorobenzyl)borate, di(carbomethoxyphenyl)methylsulfonium hexafluorophosphate, (4-octyloxyphenyl)diphenylsulfonium tetrakis(3,5-bis-trifluoromethylphenyl)borate, tris[4-(4-acetylphenyhthiophenyl]sulfonium tetrakis(pentafluorophenyl)borate, tris(dodecylphenyl)sulfonium tetrakis(3,5-bis(trifluoromethyl)phenyl)borate, 4-acetamidophenyldiphenylsulfonium tetrafluoroborate, 4-acetamidophenyldiphenylsulfonium tetrakis(pentafluorobenzyl)borate, dimethylnaphthylsulfonium hexafluorophosphate, trifluoromethyldiphenylsulfonium tetrafluoroborate, trifluoromethyldiphenylsulfonium tetrakis(pentafluorobenzyl)borate, phenylmethylbenzylsulfonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate, iodonium salts (see, for example, U.S. Pat. No. 3,729,313 A, 3,741,769 A, 4,250,053 A, 4,394,403 A and US 2010/063221 A1), such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulfonylphenyl)iodonium hexafluorophosphate, di(4-acetamidophenyl) iodonium hexafluorophosphate, di(2-benzothienyl)iodonium hexafluorophosphate, diaryliodonium tristrifluoromethylsulfonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulfonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluorophenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulfonate, bis(4-tert-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulfonate, di(dodecylphenyl)iodonium hexafluoroantimonate, di(dodecylphenyl)iodonium triflate, diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bissuccinimidodiphenyliodonium bisulfate, 3-nitrodiphenyliodonium bisulfate, 4,4'-dimethoxydiphenyliodonium bisulfate, bis(dodecylphenyl)iodonium tetrakis(pentafluorophenyl)borate, (4-octyloxyphenyl)phenyliodonium tetrakis(3,5-bistrifluoromethylphenyl)borate and (tolylcumyl)iodonium tetrakis(pentafluorophenyl)borate, and ferrocenium salts (see for example EP 542 716 B1) such as $\eta_5$-(2,4-cyclopentadien-1-yl)[(1,2,3,4,5,6,9)(1-methylethyl)benzene]iron.

Examples of commercialized photoinitiators (curing agents) include Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI-301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

The person skilled in the art is aware of further systems that are likewise usable in accordance with the invention. Photoinitiators (photo curing agents) are used in uncombined form or as a combination of two or more photoinitiators.

Photoinitiators which exhibit absorption at less than 350 nm and advantageously at greater than 250 nm are advantageous. Initiators which absorb above 350 nm, for example in the range of violet light, are likewise employable. Particular preference is given to using sulfonium-based photoinitiators since they exhibit advantageous UV-absorption characteristics.

It is also advantageous to choose initiators that can be activated by both kinds of activation: by heat and by radiation. It is also possible to employ combinations of thermally and photochemically activatable initiators (curing agents).

Even though preference is given to TAG and PAG systems in combination with the functionalized (co)polymers of the invention, other initiator/curing agent systems are also conceivable alternatively or in combination. Here too, preference is given to systems that have latency in the formulation.

Examples include latently reactive diamines or multifunctional amines, dicarboxylic acids or multifunctional carboxylic acids, difunctional acid anhydrides or multifunctional acid anhydrides, primary dithiols or multifunctional primary thiols. Particularly advantageous coreactants with regard to latency are those that are solid at room temperature and, in the non-softened state, are not soluble in the polymer of the invention or a mixture containing said polymer, but are soluble in the softened state or the two melts are miscible with one another.

Also conceivable are initiators/curing agents that are in encapsulated form and are distributed in the film matrix under the influence of heat and can then lead to reaction.

Further Optional Constituents (C)

It is optionally possible to add further constituents to the adhesive compositions of the invention that adjust the properties of the adhesive system as desired. Mention should be made in this connection of film formers (C1: typically up to 79.9% by weight based on the overall formulation), tackifying resins (C2: typically up to 25% by weight based on the overall formulation), low-viscosity reactive resins (C3: typically up to 50% by weight) and getters/scavengers (C4: up to 50% by weight based on the overall formulation).

(C1) Film Formers

Suitable film formers for adhesive compositions of the invention are thermoplastic materials, elastomers and thermoplastic elastomers. They are especially chosen such that they do not impair the barrier properties of the adhesive layer, but preferably improve them further. Nonpolar materials are therefore advantageous. Preference is additionally given to film formers which, even in combination with the other constituents of the adhesive composition, permit the achievement of adhesive layers that have a very low yellowness value (test E) and high transparency (high transmittance: test F1; low haze: test F2).

Thermoplastic materials are conceivable as film formers, but are not preferred when transparent adhesive layers are desired. Examples are semicrystalline polyolefins and ethylene-vinyl acetate copolymers (EVA).

Elastomers are more advantageous. Examples include polyisobutylene, polybutylene, EPDM, styrene-butadiene copolymers (SBR), natural rubber, nitrile rubber, and the (partly) hydrogenated variants and poly(meth)acrylates thereof.

Also advantageous are thermoplastic elastomers and here especially block copolymers, star copolymers and/or graft copolymers having a (weight-average) molar mass $M_w$ of 300 000 g/mol or less, preferably 200 000 g/mol or less. Smaller molar masses are preferred owing to their improved processibility. However, the molar masses should preferably be above 50 000 g/mol.

Specific examples are styrene-butadiene block copolymers (SBS), styrene-isoprene block copolymers (SIS), styrene-(isoprene/butadiene) block copolymers (SIBS) and (partly) hydrogenated variants such as styrene-(ethylene/butylene) block copolymers (SEBS), styrene-(ethylene/propylene) block copolymers (SEPS, SEEPS), styrene-(butylene/butyl) block copolymers (SBBS) and very preferably styrene-isobutylene block copolymers (SiBS). These block copolymers may be used in the form of a linear or multiarm structure, in the form of a diblock copolymer, triblock copolymer or multiblock copolymer, or in the form of mixtures of different types.

Very preferably, triblock copolymers of the polystyrene-block-polyisobutylene-block-polystyrene type are used. Systems of this kind have become known under the SIBStar name from Kaneka and the Oppanol IBS name from BASF. Further advantageously usable systems are described in EP 1 743 928 A1.

(C2) Tackifying Resins

The adhesive composition of the invention optionally comprises one or more types of a tackifying resin, advantageously those that are compatible with the (co)polymer (A) and/or if appropriate with further constituents (C1).

It is advantageous when this tackifying resin has a tackifying resin softening temperature (ASTM E28) of greater than 25° C., especially of greater than 80° C.

Tackifying resins (C2) used in the adhesive composition may, for example, be partly or fully hydrogenated or disproportionated resins based on rosin and rosin derivatives, hydrogenated polymers of dicyclopentadiene, partly, selectively or fully hydrogenated hydrocarbon resins based on $C_5$, $C_5/C_9$ or $C_9$ monomer streams, polyterpene resins based on α-pinene and/or β-pinene and/or δ-limonene, hydrogenated polymers of preferably pure $C_8$ and $C_9$ aromatics. The aforementioned tackifying resins can be used either alone or in a mixture.

In order to assure high aging and UV stability, preference is given to hydrogenated resins having a hydrogenation level of at least 90%, preferably of at least 95%.

Additionally preferred, especially in combination with nonpolar film formers, are nonpolar resins having a DACP (diacetone alcohol cloud point) value of above 30° C. and an MMAP (mixed methylcyclohexane-aniline point) value of greater than 50° C., especially having a DACP value above 37° C. and an MMAP value greater than 60° C. The DACP value and the MMAP value each indicate solubility in a particular solvent mixture (see C. Donker, PSTC Annual Technical Seminar Proceedings, May 2001, p. 149-164). The selection of these ranges achieves a particularly high permeation barrier, especially against water vapor. (Partly) hydrogenated hydrocarbon resins are preferably used only when the formulation also contains at least one nonpolar, especially hydrocarbon-based, film former (C1).

(C3) Low-Viscosity Reactive Resins

Reactive resins may be used optionally but advantageously. They are preferably used in a proportion in the overall formulation of at most 50% by weight, preferably of at most 25% by weight, very preferably of at most 10% by weight. These low-viscosity reactive resins are especially cyclic ethers, i.e. compounds which bear at least one oxirane group, or oxetanes. They may be aromatic or especially aliphatic or cycloaliphatic in nature. Usable reactive resins may be monofunctional, difunctional, trifunctional or tetrafunctional or have higher functionality up to polyfunctionality, the functionality relating to the cyclic ether group.

Examples, without wishing to impose a restriction, are 3,4-epoxycyclohexylmethyl-3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, ethane 1,2-diglycidyl ether and derivatives, propane 1,3-diglycidyl ether and derivatives, butane-1,4-diol diglycidyl ether and derivatives, higher alkane 1,n-diglycidyl ethers and derivatives, bis[(3, 4-epoxycyclohexyl)methyl] adipate and derivatives, vinylcyclohexyl dioxide and derivatives, cyclohexane-1,4-dimethanolbis(3,4-epoxycyclohexane carboxylate) and derivatives, diglycidyl 4,5-epoxytetrahydrophthalate and derivatives, bis[1-ethyl(3-oxetanyl)methyl] ether and derivatives, pentaerythritol tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolaks, hydrogenated epoxyphenol novolaks, epoxycresol novolaks, hydrogenated epoxycresol novolaks, 2-(7-oxabicyclospiro(1,3-dioxane-5,3'-(7-oxabicyclo[4.1.0]-heptane)), 1,4-bis((2,3-epon/propoxy)methyl)cyclohexane. Here too, preference is given to (cyclo)aliphatic epoxides.

Reactive resins may be used in their monomeric form or else dimeric form, trimeric form etc., up to their oligomeric form, especially if the weight-average molecular weight does not reach 5000 g/mol.

Mixtures of reactive resins with one another, or else with other co-reactive compounds such as alcohols (monofunctional or polyfunctional) or vinyl ethers (monofunctional or polyfunctional) are likewise possible.

(C4) Optional Getters/Scavengers

In a further advantageous execution of the present invention, fillers that can interact in a particular manner with oxygen and/or water vapor are also used. Oxygen or water vapor that penetrates into the (opto)electronic arrangement is then bound chemically or physically to these fillers. These fillers are also referred to as "getters", "scavengers", "desiccants" or "absorbers". Fillers of this kind include, by way of example but without restriction, oxidizable metals, halides, salts, silicates, oxides, hydroxides, sulfates, sulfites, carbonates of metals and transition metals, perchlorates and activated carbon, including polymorphs thereof. Examples are cobalt chloride, calcium chloride, calcium bromide, lithium chloride, zinc chloride, zinc bromide, silicon dioxide (silica gel), aluminum oxide (activated aluminum), calcium sulfate, copper sulfate, sodium dithionite, sodium carbonate, magnesium carbonate, titanium dioxide, bentonite, montmorillonite, diatomaceous earth, zeolites and oxides of alkali metals/alkaline earth metals, such as barium oxide, calcium oxide, iron oxide and magnesium oxide, or else carbon nanotubes. In addition, it is also possible to use organic absorbers, for example polyolefin copolymers, polyamide copolymers, PET copolyesters or further absorbers based on hybrid polymers, which are usually used in combination with catalysts, for example cobalt. Further organic absorbers are, for instance, lightly crosslinked polyacrylic acid, ascorbates, glucose, gallic acid or unsaturated fats and oils. Halogen-free systems are preferred.

In one version of the invention, in order to achieve maximum efficacy of the getters/scavengers with respect to the barrier effect, the getter content should not be too small. The proportion is preferably at least 5% by weight, further preferably at least 10% by weight and very preferably at least 15% by weight. Typically, a maximum proportion of getters is used without too significantly impairing the bonding forces of the adhesive composition or impairing other properties. According to the getter type, getter contents of up to 50% by weight may be used.

Further optional constituents (C) that may be added as additives to the adhesive composition are customary admixtures such as aging stabilizers (antiozonants, antioxidants, light stabilizers etc.).

Possible additives to the adhesive system include the following:
  primary antioxidants, for example sterically hindered phenols,
  secondary antioxidants, for example phosphites or thioethers
  processing stabilizers, for example C-radical scavengers
  light stabilizers, for example UV absorbers or sterically hindered amines
  processing auxiliaries
  wetting additives
  compatibilizers
  adhesion promoters
  colorants/pigments The admixtures or additives are not obligatory; one advantage of the adhesive composition of the invention is that it has its advantageous properties even without addition of additional additives individually or in any combination. Nevertheless, it may be advantageous and desirable in the specific case to adjust particular further properties of the adhesive composition by addition of additives.

For example, it is possible to influence the transparency of the material and its color. Some formulations are visually clear, others are opaque, and others again are colored, white, black or gray.

Among the optional admixtures/additives as well, those chosen, prior to the initiation of the curing reaction, enter into essentially no reaction or especially no reaction at all with epoxy functionalities or neither initiate nor catalyze the reactions of the epoxy functionalities, or have reactivity with epoxy functionalities that has been suppressed in some other way.

In combination with silane-based comonomers (d), if these are used, or else alternatively, adhesion promoters used may be further silanes that are not incorporated into the functionalized (co)polymers (A) of the invention by polymerization.

Examples of silanes usable in the context of this invention, without wishing to impose a restriction, are methyltrimethoxysilane, methyltriethoxysilane, dimethyldimethoxysilane, dimethyldiethoxysilane, trimethylethoxysilane, ethyltrimethoxysilane, propyltrimethoxysilane, propyltriethoxysilane, isobutyltrimethoxysilane, isobutyltriethoxysilane, octyltrimethoxysilane, octyltriethoxysilane, isooctyltrimethoxysilane, isooctyltriethoxysilane, hexadecyltrimethoxysilane, hexadecyltriethoxysilane, octadecylmethyldimethoxysilane, phenyltrimethoxysilane, phenyltriethoxysilane, cyclohexylmethyldimethoxysilane, dicyclopentyldimethoxysilane.

One example of silyl-functionalized oligomers or polymers that may be used in accordance with the invention is polyethylene glycol joined to a trimethoxysilane group.

Further examples of usable silanes that bear at least one functionalization are vinyltrimethoxysilane, vinyltriethoxysilane, vinyltri(2-methoxyethoxy)silane, vinyltriisopropoxysilane, vinyldimethoxymethylsilane, vinyltriacetoxysilane, 3-glycidyloxypropyltrimethoxysilane, 3-glycidyloxypropyltriethoxysilane, 2-(3,4-epoxycyclohexyl)ethyltriethoxysilane, 3-glycidyloxypropyldiethoxymethylsilane, 3-methacryloyloxypropyltrimethoxysilane, 3-methacryloyloxypropyltriethoxysilane, 3-methacryloyloxypropyltriisopropoxysilane, 3-methacryloyloxypropyldimethoxymethylsilane, 3-methacryloyloxypropyldiethoxymethylsilane, 3-chloropropyltrimethoxysilane, 3-chloropropyltriethoxysilane, 3-ureidopropyltrimethoxysilane, 3-ureidopropyltriethoxysilane, 2-hydroxy-4-(3-triethoxysilylpropoxy)benzophenone, 4-(3'-chlorodimethylsilylpropoxy)benzophenone.

Fillers may be used in the adhesive compositions of the invention. Fillers used in the adhesive composition are preferably nanoscale and/or transparent fillers. A filler is referred to as "nanoscale" in the present context when it has a maximum extent in at least one dimension of 100 nm, preferably of 10 nm. Particular preference is given to using those fillers that are transparent in the composition and have a platelet-like crystallite structure and a high aspect ratio with homogeneous distribution. The fillers having platelet-like crystallite structure and aspect ratios well above 100 generally have a thickness of only a few nm, but the length or width of the crystallites may be up to a few μm. Fillers of this kind are likewise referred to as nanoparticles. The particulate configuration of the fillers having small dimensions is additionally particularly advantageous for a transparent version of the adhesive composition.

The construction of labyrinth-like structures with the aid of the above-described fillers in the adhesive matrix extends the diffusion pathway of oxygen and water vapor, for example, in such a way that their permeation through the adhesive layer is reduced. For better dispersibility of these fillers in the binder matrix, these fillers may be surface modified with organic compounds. The use of fillers of this kind per se is known, for example, from US 2007/0135552 A1 and WO 02/026908 A1.

In addition, maximum fineness of distribution and maximum surface area of the fillers is advantageous. This enables higher efficacy and higher loading capacity, and is especially achieved with nanoscale fillers.

The fillers are not obligatory; the adhesive composition works even without addition of these individually or in any combination. Among the optional fillers/getters/scavengers as well, those chosen, prior to the initiation of the curing process, enter into essentially no reaction or especially no reaction at all with epoxy functionalities or initiate or catalyze no reactions of the epoxy functionalities, or reactivity with epoxy functionalities has been suppressed in some other way.

Product Constructions

Particularly advantageously, the adhesive composition of the invention can be used in a single- or double-sidedly adhesive tape. This mode of administration enables particularly easy and uniform application of the adhesive composition.

The general expression "adhesive tape" here encompasses a carrier material provided with an adhesive composition on one or both sides. The carrier material includes any flat structures, for example films or film sections elongated in two dimensions, tapes having extended length and limited width, tape sections, die-cut parts (for example in the form of edges or boundaries of an (opto)electronic arrangement), multilayer arrangements and the like. For various applications, it is possible to combine a wide variety of different carriers, such as films in particular, with the adhesive compositions. In addition, the term "adhesive tape" also encompasses what are called "transfer adhesive tapes", i.e. an adhesive tape with no carrier. In the case of a transfer adhesive tape, the adhesive composition is instead applied prior to application between flexible liners provided with a release layer and/or having anti-adhesive properties. For application, it is regularly the case that one liner is first removed, the adhesive composition is applied, and then the second liner is removed. The adhesive composition can thus be used directly for bonding of two surfaces in (opto)electronic arrangements.

Also possible are adhesive tapes in which there are not two liners but instead a single double-sidedly separating liner. In that case, the adhesive tape web is covered on its top side by one side of a double-sidedly separating liner and on its bottom side by the reverse side of the double-sidedly separating liner, especially of an adjacent winding in a bale or a roll.

The carrier material used for a single-sidedly adhesive tape in the present context preferably comprises polymer films, film composites, or films or film composites provided with organic and/or inorganic layers. Films/film composites of this kind may consist of any standard plastics used for film production, by way of example but without restriction:

polyethylene, polypropylene—especially oriented polypropylene produced by mono- or biaxial stretching (OPP), cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyether sulfone (PES) or polyimide (PI).

The carrier may additionally be combined with organic or inorganic coatings or layers. This can be accomplished by customary methods, for example painting, printing, vapor deposition, sputtering, coextrusion or lamination. Mention is made here by way of example, but without restriction, for instance, of oxides or nitrides of silicon and aluminum, indium tin oxide (ITO) or sol-gel coatings.

Very good carrier films are also those made of thin glasses. These are available in layer thicknesses of less than 1 mm and even in 30 μm, for example D 263 T from Schott or Willow Glass from Corning. Thin glass films can be further stabilized by laminating a polymer film (for example polyester) onto them by means of a transfer adhesive tape, if desired.

Thin glasses used are preferably support materials of this kind or other kinds having a thickness of 15 to 200 μm, preferably 20 to 100 μm, further preferably 25 to 75, especially preferably 30 to 50 μm.

Advantageously, for thin glasses, a borosilicate glass such as D263 T eco from Schott, an alkali metal/alkaline earth metal silicate glass or an aluminoborosilicate glass such as AF 32 eco from Schott is used. An alkali metal-free thin glass such as AF 32 eco is advantageous because UV transmission is higher. An alkali metal-containing thin glass such as D263 T eco is advantageous because the coefficient of thermal expansion is higher and matches better to the polymeric constituents of the rest of the OLED assembly. Glasses of this kind can be manufactured in the down-draw process as referenced in WO 00/41978 A1, or in processes as disclosed, for example, in EP 1 832 558 A1. WO 00/41978 A1 further discloses processes for producing composites from thin glass and polymer layers or films.

More preferably, these films/film composites, especially the polymer films, are provided where the permeation barrier for oxygen and water vapor, where the permeation barrier exceeds the demands for the packaging sector (typically WVTR<$10^{-1}$ g/(m$^2$d) and OTR<$10^{-1}$ cm$^3$/(m$^2$d bar)).

In the case of thin glass films or thin glass film composites, owing to the intrinsically high barrier properties of the glass, no corresponding coating is required.

Thin glass films or thin glass film composites are preferably provided, as is generally also the case for polymer films, in strip form from a roll. Corresponding glasses are already being supplied by Corning under the Willow Glass name. This supply form can be laminated with an adhesive composition preferably likewise provided in strip form. For this purpose, a pressure-sensitively adhesive configuration of the adhesive composition is an option.

In addition, the films/film composites, in a preferred configuration, may be in transparent form, in order that the overall construction of such an adhesive article is also in transparent form. "Transparency" here also means an average transmission in the visible region of light of at least 75%, preferably higher than 90% (by test F1), and a haze of at most 5.0%, especially of at most 2.5% (by test F2).

In the case of double-sidedly adhesive curable adhesive tapes, the upper and lower layers employed may be inventive adhesive compositions of the same or different kind(s) and/or of the same layer or different layer thickness(es). The carrier on one or both sides may have been pretreated in accordance with the prior art, such that, for example, an improvement in adhesive composition anchoring is achieved. It is likewise possible for one or both sides to have been provided with a functional layer which can function, for example, as barrier layer.

In one variant, in the double-sidedly adhesive curable adhesive tape, an inventive adhesive composition is provided, as is one further adhesive composition, for example any having particularly good adhesion to a covering substrate or exhibiting particularly good repositionability.

In addition, the curable adhesive composition and any adhesive tape formed therewith, in the cured state, has excellent suitability for encapsulation of an electronic arrangement against permeates, in that the adhesive composition or adhesive tape is applied to and/or around the regions of the electronic arrangement to be encapsulated and is simultaneously or subsequently activated for the curing.

Encapsulation in the present context refers not only to complete enclosure with the adhesive composition mentioned but also even to application of the adhesive composition to the regions of the (opto)electronic arrangement to be encapsulated, for example a single-sided cover or frame around an electronic structure.

In principle, adhesive tapes can be used to implement two modes of encapsulation. Either the adhesive tape is diecut beforehand and bonded only around the regions to be encapsulated, or it is applied over the full area of the regions to be encapsulated. One advantage of the second variant is easier handling and frequently better protection.

If the adhesive composition is a pressure-sensitive adhesive composition, application is particularly simple since no preliminary fixing is necessary. The pressure-sensitive adhesive compositions permit flexible and clean processing. Administration as a pressure-sensitive adhesive tape also allows simple dosage of the amount of the pressure-sensitive adhesive composition. At least after application to the target substrate(s), the pressure-sensitive adhesive composition is subjected to crosslinking by thermal and/or radiation-chemical activation of the latently reactive initiator. This process sequence is also preferred.

If the adhesive composition is a non-pressure-sensitive embodiment, the bonding is effected, for example, by positioning the adhesive tape section onto a target region of a first substrate. Thermal preliminary lamination can be effected here at a temperature, the lamination temperature, at which there is still essentially no activation of the curing reaction of the epoxy groups, such that the adhesive tape section is pre-fixed. Subsequently, the second substrate is supplied and cured under heat and pressure and optionally radiation to give a sealed adhesive bond. It is also possible to dispense with the preceding pre-fixing step. In this case, the two substrates to be bonded and the adhesive tape section are combined and then cured under pressure and heat and optionally radiation to give a sealed adhesive bond. In an inline method or when various offline processes are conducted in rapid succession, the pre-lamination temperature can be utilized directly for activation of the curing reaction.

For further acceleration of the curing reaction of the activated adhesive composition in an adhesive bond, the bond can additionally be exposed to heat, i.e. heat-treated, after the activation.

These processes are of course also performable per se for pressure-sensitive embodiments.

Further details, aims, features and advantages of the present invention are elucidated in detail hereinafter by multiple figures that show preferred working examples. The figures show:

Figure 4:
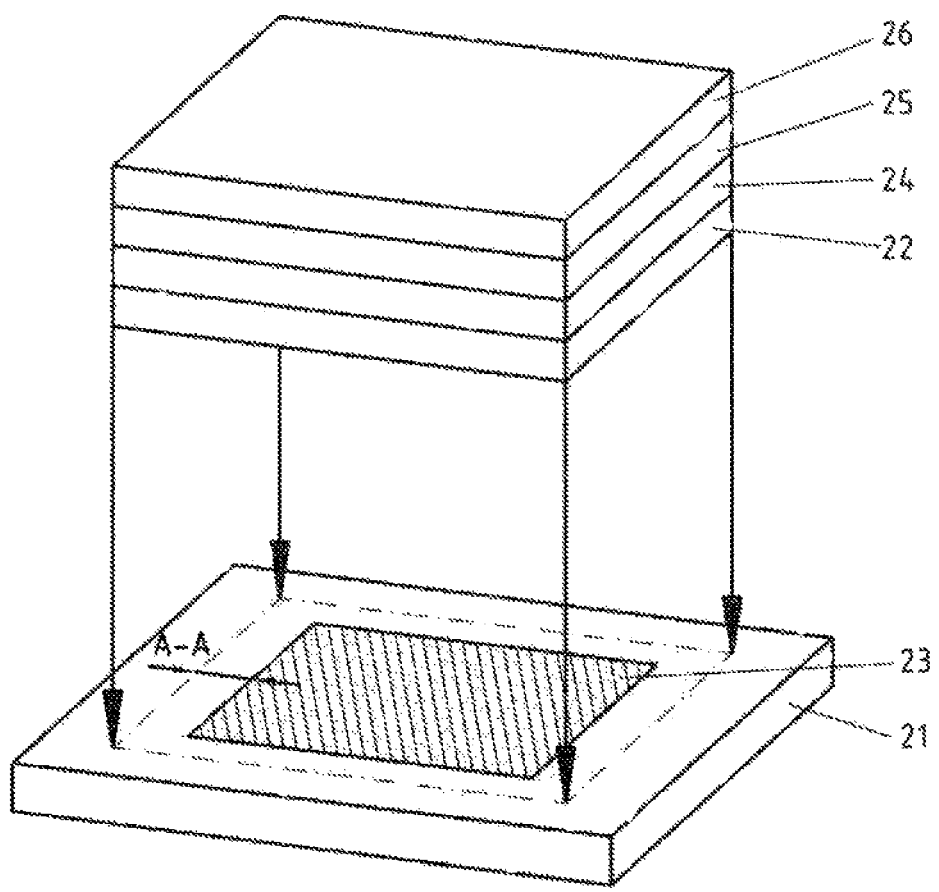

FIG. 4. Shows Test B described in the Examples; and

Figure 5:
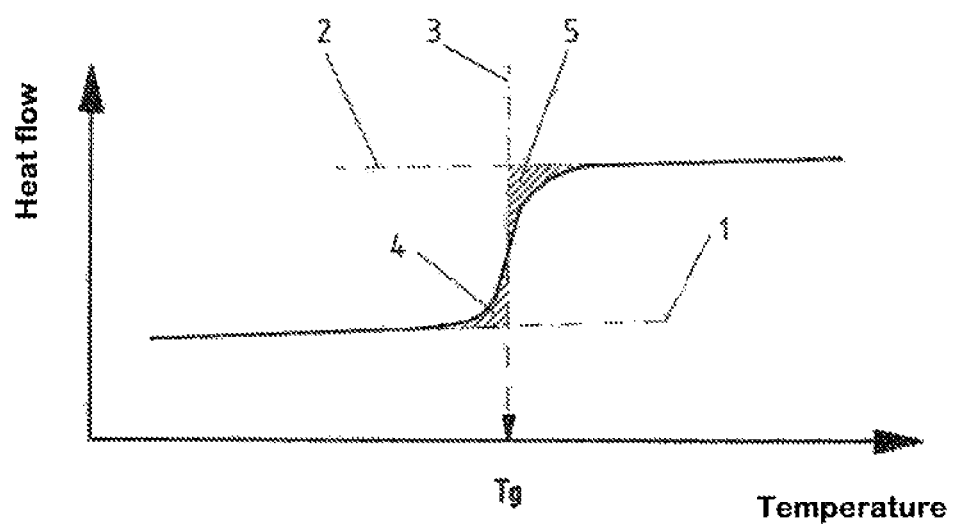

FIG. 5 shows glass transition temperature evaluated in Test D described in the Examples.

Figure 1:
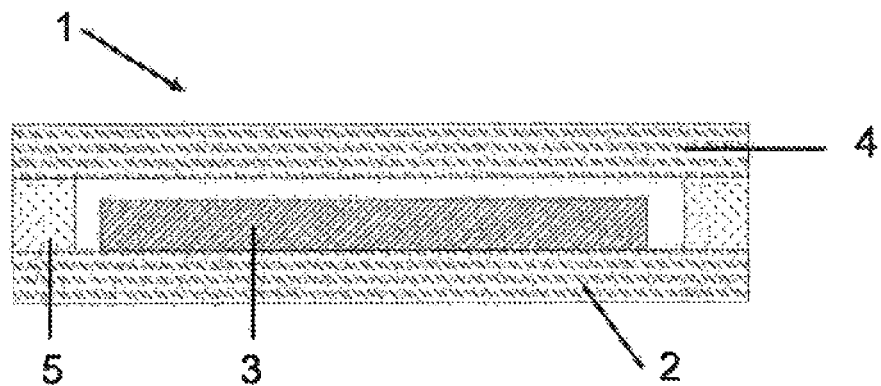
FIG. 1 shows a first (opto)electronic arrangement in schematic view.

FIG. 1 shows a first configuration of an (opto)electronic arrangement 1. This arrangement 1 has a substrate 2 with an electronic structure 3 disposed thereon. The substrate 2 itself takes the form of a barrier for permeates and hence forms part of the encapsulation of the electronic structure 3. Above the electronic structure 3, in the present case also spaced apart therefrom, is disposed a further cover 4 that takes the form of a barrier.

In order to encapsulate the electronic structure 3 at the side as well and simultaneously to bond the cover 4 to the electronic arrangement 1 in addition, an adhesive composition 5 is provided around the periphery alongside the electronic structure 3 on the substrate 2. In other embodiments, the encapsulation is effected not with a straight adhesive composition 5 but with an adhesive tape 5 comprising at least one adhesive composition of the invention. The adhesive composition 5 bonds the cover 4 to the substrate 2. By means of an appropriately thick configuration, the adhesive composition 5 additionally enables the cover 4 to be spaced apart from the electronic structure 3.

The adhesive composition 5 is one based on the adhesive composition of the invention as described above in general form. The adhesive composition 5 in the present case not only assumes the function of bonding substrate 2 to the cover 4 but additionally also forms a barrier layer for permeates in order thus to encapsulate the electronic structure 2 from the side as well against permeates such as water vapor and oxygen. It is applied as a curable adhesive composition and takes on the final bonding function after activation in the cured state.

The adhesive composition 5 in the present context is additionally provided in the form of a diecut from a double-sided adhesive tape. Such a diecut enables particularly simple application.

Figure 2:
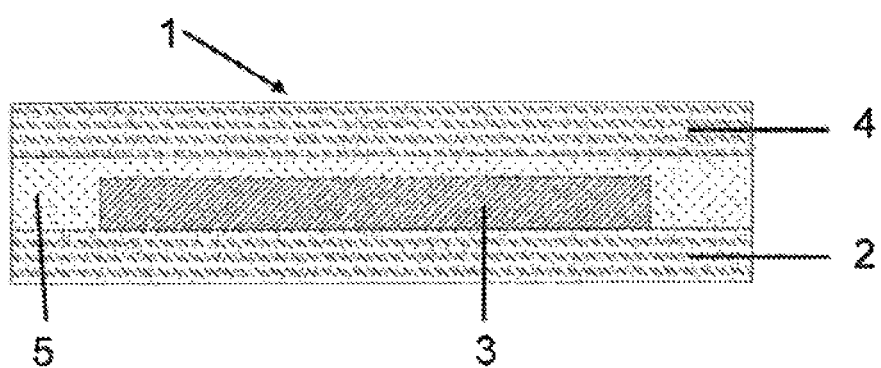
FIG. 2 shows a second (opto)electronic arrangement in schematic view.

FIG. 2 shows an alternative configuration of an (opto) electronic arrangement 1. What is shown is again an electronic structure 3 disposed on a substrate 2 and encapsulated by the substrate 2 from beneath. Above and to the side of the electronic structure, the adhesive composition 5 has now been arranged over the full area. The electronic structure 3 is thus encapsulated fully by the adhesive composition 5 from above. A cover 4 has then been applied to the adhesive composition 5. In contrast to the above configuration, this cover 4 need not necessarily satisfy the high barrier demands, since the barrier is already provided by the adhesive composition. The cover 4 may, for example, merely assume a mechanical protective function, but it may also additionally be provided as a permeation barrier.

Figure 3:
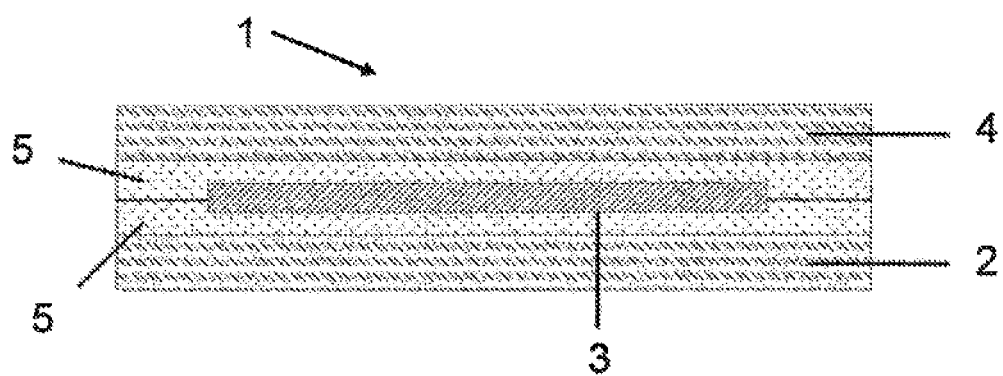
FIG. 3 shows a third (opto)electronic arrangement in schematic view.

FIG. 3 shows a further alternative configuration of an (opto)electronic arrangement 1. In contrast to the above configurations, two adhesive compositions 5a, 5b are now provided, which are identical in the present case. The first adhesive composition 5a is disposed over the full area of the substrate 2. The electronic structure 3 is provided upon and is fixed by the adhesive composition 5a. The composite composed of adhesive composition 5a and electronic structure 3 is then fully covered by the further adhesive composition 5b, such that the electronic structure 3 is encapsulated from all sides by the adhesive compositions 5a, b. The cover 4 is in turn provided above the adhesive composition 5b.

In this configuration, therefore, neither the substrate 2 nor the cover 4 need necessarily have barrier properties. They may nevertheless be provided, in order to further restrict the permeation of permeates to the electronic structure 3.

Especially with regard to FIGS. 2 and 3, it is pointed out that these are schematic diagrams. More particularly, it is not clear from the diagrams that the adhesive composition 5 is applied here and preferably in each case with homogeneous layer thickness. There is therefore no sharp edge formed at the transition to the electronic structure, as appears to be the case in the diagram; instead, the transition is fluid and it is in fact possible for small unfilled or gas-filled regions to remain. If necessary, however, matching to the substrate may also be effected, especially when the application is conducted under reduced pressure or under elevated pressure. Moreover, the adhesive composition is subject to different degrees of local compression, and so flow processes, especially also at elevated temperature, can result in a certain degree of compensation for the height differential at the edge structures. The dimensions shown are not to scale either, but instead serve merely for better illustration. Especially the electronic structure itself is generally relatively flat (often less than 1 μm thick).

In all working examples shown, the adhesive composition 5 is applied in the form of an adhesive tape. This may in principle be a double-sided adhesive tape having a carrier or a transfer adhesive tape. In the present context, a configuration as a transfer adhesive tape has been chosen.

The thickness of the adhesive composition present either in the form of a transfer adhesive tape or coated on a flat structure is preferably between 1 μm and 150 μm, further preferably between 5 μm and 75 μm and more preferably between 12 μm and 50 μm. High layer thicknesses between 50 μm and 150 μm are used when improved adhesion on the substrate and/or a damping effect is to be achieved within the (opto)electronic assembly. However, a disadvantage here is the elevated permeation cross section. Small layer thicknesses between 1 μm and 12 μm reduce the permeation cross section, and hence the lateral permeation and total thickness of the (opto)electronic assembly. However, there is a reduction in adhesion on the substrate. In the particularly preferred thickness ranges lies a good compromise between a low composition thickness and the consequent low permeation cross section that reduces lateral permeation and a sufficiently thick composition film for production of a sufficiently adhesive bond. The optimal thickness depends on the (opto)electronic assembly, the final application, the mode of execution of the adhesive composition and possibly the two-dimensional substrate.

For double-sided adhesive tapes, it is likewise the case for the barrier adhesive composition(s) that the thickness of the individual adhesive composition layer(s) is preferably between 1 μm and 150 μm, further preferably between 5 μm and 75 μm and more preferably between 12 μm and 50 μm. If a further barrier adhesive composition is used in addition to one barrier adhesive composition of the invention in double-sided adhesive tapes, it may also be advantageous if the thickness thereof is above 150 μm.

A suitable process for bonding the adhesive products to the adhesive compositions of the invention includes freeing the first adhesive surface of a protective liner layer and lamination of the adhesive product to a first target substrate. This can be effected by lamination by means of (rubber) rollers or else in presses. An elevated temperature may be used here. Any pressure-sensitive adhesiveness means that a particularly high pressure is not required in every case in the lamination. A preliminary bond is obtained. Subsequently, the second adhesive surface is also freed of the protective liner layer and applied to the second target substrate. This too can be effected by lamination by means of (rubber) rollers or else in presses. The selection of the lamination process is guided here by the characteristics of the preliminary bond (rigid or flexible) and the second target substrate (rigid or flexible). It is possible to work at elevated temperature here too. Here too, a particularly high pressure is not required in every case in the lamination by virtue of any pressure-sensitive adhesiveness. In order to induce curing of the composite, heat and/or radiation has to be introduced at some juncture, preferably during and/or after the second lamination step in the above-specified cycle. This can be effected by utilization of a heating press which is utilized in the lamination, or by means of a heating tunnel equipped with an IR zone, for example, or a radiation source (especially for UV). Also particularly suitable are heat chambers and autoclaves. The latter are particularly suitable when the composite is to be subjected to pressure in order to finally optimize the laminate quality. In the supply of heat, it should be ensured that the temperature is sufficient to activate the latently reactive thermally activatable initiator, but that sensitive component elements are not thermally damaged.

The invention is elucidated in detail hereinafter by examples without any intention of restricting the invention thereby.

EXAMPLES

Test Methods
Test A—Volume Permeability (OTR, WVTR)

Permeability for oxygen (OTR) and water vapor (WVTR) are determined according to DIN 53380 Part 3 or ASTM F-1249. For this purpose, the adhesive composition is applied to a permeable membrane at a layer thickness to be specified (for example 50 μm) and then cured at 120° C. for 30 min. Alternatively, it is also possible to examine a film. Oxygen permeability is determined at 23° C. and a relative humidity of 50%, measured with a Mocon OX-Tran 2/21 measuring instrument. Water vapor permeability is determined at 37.5° C. and a relative humidity of 90%.

Test B—Lag Time

A calcium test was used as a measure for determining the lifetime of an (opto)electronic assembly. Said calcium test is shown in FIG. 4. In this test a thin calcium layer 23 having dimensions of 10×10 mm² is deposited on a glass plate 21 under reduced pressure and then stored under a nitrogen atmosphere. The thickness of the calcium layer 23 is about 100 nm. For the encapsulation of the calcium layer 23, an adhesive tape (23×23 mm²) having the adhesive composition 22 to be tested and a thin glass slide 24 (30 μm, from Schott) as carrier material are used. For stabilization, the thin glass slide was laminated with a 100 μm-thick PET film 26 by means of a 50 μm-thick transfer adhesive composition tape 25 of an acrylate pressure-sensitive adhesive composition of visually high transparency. The adhesive composition 22 is applied to the glass slide 21 at 70° C. in such a way that the adhesive composition 22 covers the calcium mirror 23 with an excess margin of 6.5 mm on all sides (A-A). Curing was effected at 120° C. for 30 min. Because of the impervious glass carrier 24, only the permeation through the adhesive composition or along the interfaces is determined.

The test is based on the reaction of calcium with water vapor and oxygen, as described, for example, by A. G. Erlat et. al. in "47th Annual Technical Conference Proceedings—Society of Vacuum Coaters", 2004, pages 654 to 659, and by M. E. Gross et al. in "46th Annual Technical Conference Proceedings—Society of Vacuum Coaters", 2003, pages 89 to 92. This involves monitoring the light transmission of the calcium layer, which increases as a result of the conversion to calcium hydroxide and calcium oxide. In the test setup described, this is done from the edge, such that the visible area of the calcium mirror decreases. The time until the light absorption of the calcium mirror halves is referred to as lifetime, and the time until onset of a steady decrease in the absorption as "lag time". The method covers both the decrease in the area of the calcium mirror from the edge and via point degradation in the area and the homogeneous reduction in the layer thickness of the calcium mirror resulting from full-area degradation.

The measurement conditions chosen were 85° C. and 85% relative air humidity. The specimens were bonded with a layer thickness of the pressure-sensitive adhesive composition of 50 μm over the full area and with no bubbles. The measurements were made on crosslinked adhesive tapes. The measured value (in h) was obtained as the average value from three individual measurements.

Test C—Molar Mass (GPC)

Molar masses are determined using a clear-filtered 100 μL sample (sample concentration 1.5 g/L). The eluent used is tetrahydrofuran with 0.1% by volume of trifluoroacetic acid, and the internal standard 200 ppm (m/v) of toluene. The measurement is made at 25° C.

The pre-column used is a column of the PSS-SDV type, 10 μm, ID 8.0 mm×50 mm (values here and hereinafter in the sequence: type, particle size, internal diameter×length). Separation is accomplished using a column of the PSS-SDV type, 10 μm linear one, ID 8.0 mm×300 mm (column and detector from Polymer Standards Service; detection by means of PSS-SECcurity 1260 RID detector). The flow rate is 0.5 mL per minute. Calibration is conducted with polystyrene standards in the separation region of the column, and converted universally to a polymethylmethacrylate calibration with utilization of the known Mark-Houwink coefficients a and K.

Test D—Glass Transition Temperature, Activation Temperature (DSC)

D1: Glass transition temperature ($T_G$) is determined by means of dynamic differential calorimetry (DSC: differential scanning calorimetry) using a Netzsch DSC 204 F1. The sample is weighed into reinforced aluminum crucibles (lid manually perforated). The temperature program runs two heating ramps, firstly cooling from 25° C. to −100° C. with liquid nitrogen and heating up to 180° C. at 10 K/min. Glass transitions are recognized as steps in the thermogram. The glass transition temperature is evaluated as follows (in this regard, see FIG. 5). A tangent is applied in each case to the baseline of the thermogram before 1 and after 2 of the step. In the region of the step, a line 3 of best fit is placed parallel to the ordinate in such a way that the two tangents intersect, specifically such as to form two areas 4 and 5 (between the respective tangent, the line of best fit, and the measurement plot) of equal content. The point of intersection of the line of best fit positioned accordingly and the measurement plot gives the glass transition temperature. Subsequently, the sample is cooled back down to −100° C. and heated up to 250° C. at 10 K/min. The first and second heating ramps are evaluated. The glass transition temperature thus ascertained in the first heating curve corresponds to the glass transition temperature of the uncrosslinked polymer. The glass transition temperature ascertained, resulting from the second heating curve, corresponds to a glass transition temperature of the polymer crosslinked by the thermal stress of the measurement, or of a polymer or formulation crosslinked by the activation of a thermal crosslinker/initiator, in the case that one is present in a polymer or formulation. This measurement cycle can also be utilized for analysis of the glass transition temperature of cured adhesive composition/tape specimens or for unreactive materials.

D2: The activation temperature required for the thermal curing of the cationically curable reactive resins is determined via differential scanning calorimetry (DSC). The specimens are analyzed in Al crucibles with a perforated lid and nitrogen atmosphere. In order to achieve good coverage of the crucible base with the sample, the specimen in the instrument is first heated up to 40° C. and cooled back down to 25° C. The actual measurement is started at 25° C.; the heating curve runs at a heating rate of 10 K/min. The first heating curve is evaluated. The onset of the thermally initiated curing reaction is registered by the measurement apparatus by the associated enthalpy of reaction released and indicated as an exothermic signal (peak) in the thermogram. The activation temperature used is that temperature in this signal at which the measurement plot begins to depart from the baseline (the first derivative of the thermogram can serve as an aid for finding this point; the commencement of the reaction can be connected to the point in the thermogram at which the difference between the first derivative of the peak in question in the onset region and the first derivative of the baseline assumes a magnitude of 0.01 mW/(K min); if the diagram shows upward exothermic signals, the sign is positive; if they are shown in the downward direction, the sign is negative). In addition, the integral normalized to the amount of specimen weighed out is noted.

Test E—Color Value Δb*

The procedure of DIN 6174 is followed, and color characteristics in the three-dimensional space formed by the three color parameters L*, a* and b*, according to CIELab, are examined. This is done using a BYK Gardner spectro-guide instrument, equipped with a D/65° lamp. Within the CIELab system, L* indicates the gray value, a* the color axis from green to red, and b* the color axis from blue to yellow. The positive value range for b* indicates the intensity of the yellow color component. The reference used was a white ceramic tile with a b* of 1.86. This tile additionally serves as sample holder, onto which the adhesive layer to be tested is laminated. The color measurement is effected on the respective straight adhesive layer in a 50 μm layer thickness after it has been freed from the separation liners and cured on the tile at 120° C. for 30 min. Δb* is the difference between the color value determination for the adhesive film specimen applied to the substrate tile and the color value determination of the clean substrate tile.

Test F—Transparency

For sample preparation, a 30 μm uncured transfer adhesive tape was applied without bubbles to a polycarbonate film (125 μm Lexan 8010 with freshly uncovered surfaces; haze of this film alone 0.09%). If required, the lamination is effected at elevated temperature but below the activation temperature of the specimen (in the case of example I1 at 70° C.). The specimens were analyzed by methods F1 and F2.

F1: The transmission of the adhesive composition was determined via the VIS spectrum. The recordings of the VIS spectrum were recorded on a UVIKON 923 from Kontron. The wavelength range of the spectrum measured encompasses all wavelengths between 800 nm and 400 nm at a resolution of 1 nm. A blank measurement as reference was conducted over the entire wavelength range. For the reporting of the result, the transmission measurements were averaged within the range specified. There is no correction of interfacial reflection losses.

F2: The haze value describes the proportion of the light transmitted which is scattered forward at wide angles by the sample being irradiated. Thus, the haze value quantifies material defects in the surface or the structure that disrupt clear transparency.

The method for measurement of the haze value is described in standard ASTM D 1003. The standard entails the measurement of four transmission measurements. The degree of light transmittance is calculated for each transition measurement. The four degrees of transmittance are converted to the percentage haze value. The haze value is measured with a Haze-gard Dual from Byk-Gardner GmbH.

Test G—Refractive Index

Refractive index is determined with the aid of an Abbemat 350 refractometer (from Anton Paar) at 20° C. using sodium D light (589 nm). Pressure-sensitive adhesive composition layers are applied directly to the measurement window and the measurement is started. For non-pressure-sensitive adhesive composition layers, the two-dimensional specimen is placed onto the measurement window and pressed on by means of a stamp intended for the purpose, and the measurement is started. The result is the average from two individual measurements.

Raw Materials Used

| | | |
|---|---|---|
| Vazo ® 52 | 2,2-azobis(2,4-dimethylvaleronitrile) | from DuPont |
| TTA15 | 3,4-epoxycyclohexylmethyl methacrylate | from Tetrachem |
| K-Pure ® CXC 2678 | thermal activator based on a quaternary ammonium salt of trifluoromethanesulfonic acid | from King Industries |
| Uvacure 1500 | (3',4'-epoxycyclohexane)methyl (3,4-epoxy-cyclohexyl)carboxylate | from Allnex |
| Dynasylan ® GLYEO | 3-glycidyloxypropyltriethoxysilane | from Evonik |
| Dynasylan ® MEMO | 3-methacryloyloxypropyltrimethoxysilane | from Evonik |

Example A

A pressure-resistant 2 L polymerization reactor of a conventional type for free-radical polymerizations was charged with 100 g of 3,4-epoxycyclohexylmethyl methacrylate and 396 g of methyl ethyl ketone. After passing nitrogen gas through while stirring for 45 minutes, the reactor was heated up to product temperature 70° C. and evacuated to boiling. Subsequently, 2.0 g of 2,2-azobis(2,4-dimethylvaleronitrile) dissolved in 4.0 g of methyl ethyl ketone were added. The reaction is conducted at a constant product temperature of 70° C. under evaporative cooling. After a reaction time of 1 h, 100 g of 3,4-epoxycyclohexylmethyl methacrylate that had been preheated to 70° C. and through which nitrogen had been passed for 45 minutes were added, and 2.0 g of 2,2-azobis(2,4-dimethylvaleronitrile) dissolved in 4.0 g of methyl ethyl ketone were added. After a reaction time of 2 h, 100 g of 3,4-epoxycyclohexylmethyl methacrylate that had been preheated to 70° C. and through which nitrogen had been passed for 45 minutes were added, and 2.0 g of 2,2-azobis(2,4-dimethylvaleronitrile) dissolved in 4.0 g of methyl ethyl ketone were added. After a reaction time of 3 h, 100 g of 3,4-epoxycyclohexylmethyl methacrylate that had been preheated to 70° C. and through which nitrogen had been passed for 45 minutes were added, and 2.0 g of 2,2-azobis(2,4-dimethylvaleronitrile) dissolved in 4.0 g of methyl ethyl ketone were added. The reaction was terminated after 24 h reaction time and cooled to room temperature.

The resulting polymer had a weight-average molar mass by test C of 15 900 g/mol. It contained 100% monomers of (co)monomer type (a). The glass transition temperature of the uncured polymer was 32° C., determined from the first heating curve by test D1. The (partly) cured material produced by self-curing during the heating phase in the DSC experiment had a glass transition temperature of 72° C. in the second heating curve.

Using these DSC results, in the comparison between curable starting polymer of the invention and (partly) cured polymer, it is apparent that the rise in molar mass that proceeds during the curing reaction is associated with a rise in glass transition temperature.

Example I1

236.1 g of the polymer solution from example A (solids content 49.8% by weight) were mixed with 78.4 g of the low-viscosity reactive resin (3,4-epoxycyclohexane)methyl 3,4-epoxycyclohexylcarboxylate (Uvacure 1500, Allnex) as component (C3) and 4.0 g of 3-glycidyloxypropyltriethoxysilane as further additive, so as to result in a 63% by weight solution.

Finally, a latently reactive thermally activatable initiator was added to the solution. For this purpose, 2.0 g (1% based on the overall formulation) of K Pure TAG 2678 (King Industries) as initiator/curing agent (B) were weighed out. The initiator was made up as a 20% by weight solution in acetone and added to the abovementioned solution.

By means of a coating bar method, the formulation was coated from solution onto a siliconized PET liner and dried at 50° C. for 120 min. The coatweight was then 50 g/m². The specimen was covered with a further ply of a siliconized but more easily separable PET liner.

The activation temperature for these specimens by test D2 (DSC) was 90° C. Specimens in adhesive bonds were cured at 120° C. for 30 min.

With regard to barrier properties, a WVTR measurement (test A) was conducted. For the transfer adhesive tape of thickness 50 g/m², in the cured state, the WVTR was 192 g/m² d. A lifetime test (test B) was additionally conducted for this specimen. The lag time was >250 h.

The study of the optical properties of the cured specimens after removal of the two PET liners gave a refractive index (test G) of 1.514. Transmission (test F1) was 93% (uncorrected) and haze (test F2) was 0.9%. The yellowness index Δb was +0.09 and, after storage of the specimen on the substrate tile at 23° C. and 50% rel. humidity for 1 week, was still +0.09.

Comparative Example C1

A copolymer (A) with a smaller proportion of (co)monomer (a) by comparison was tested for lag time. The composition was 5% 3,4-epoxycyclohexylmethyl methacrylate, 5% 3-methacryloyloxypropyltrimethoxysilane, 25% n-vinylcaprolactam, 32.5% n-butyl acrylate and 32.5% 2-ethylhexyl acrylate.

The lag time for the cationically cured specimen was 0 h.

Example I1 shows that a reactive adhesive tape based on a curable adhesive composition of the invention, after curing, is of excellent suitability for encapsulation of moisture-sensitive structures. Surprisingly, volume permeability is not crucial for the encapsulation of sensitive (opto)electronics. As was to be expected per se for polar adhesive compositions based on poly(meth)acrylate, volume permeability is not at an ultimately low level. But what is of primary relevance for the encapsulation is the lag time, i.e. the lifetime of the sensitive assembly. And this application-relevant demand is fulfilled to an excellent degree by the adhesive system of the invention. For an adhesive composition system examined by comparison that is likewise an epoxy-functionalized poly(meth)acrylate (comparative example C1) but contains a distinctly smaller proportion of epoxy functionality, it is found that such a system, by contrast, is unsuitable for the encapsulation task.

Over and above the barrier properties, the adhesive tape from example I1 additionally has attractive optical properties, and so applications in optical display units, such as displays, especially OLEDs, are possible.

We claim:

1. A single- or double-sided adhesive tape comprising:
   at least one layer of a curable adhesive composition comprising the following components:
   (A) 20% to 99.9% by weight (based on the entirety of the curable adhesive composition) of a (co)polymer functionalized with epoxy groups and having a weight-average molar mass of at least 5000 g/mol, based on more than 50% to 100% by weight, (based on the entirety of the parent monomers of the epoxy-functionalized (co)polymer) of at least one type of (meth)acrylic (co)monomer (a) functionalized with an epoxy group;
   (B) 0.1% to 5% by weight (based on the entirety of the curable adhesive composition) of at least one thermally activatable curing agent that, upon thermal activation, induces cationic curing of the (co)polymer (A) with reaction of its epoxy groups by thermal means and/or by supply of UV radiation; and
   (C) optionally 0% to 79.9% by weight of further constituents,
   wherein at least one of:
   comonomers used in the preparation of the (co)polymer (A) are silicon compounds;
   one or more silanes have been mixed in the curable adhesive composition; and
   the curable adhesive composition is transparent in the visible light of the spectrum (wavelength range from about 400 nm to 800 nm), has a transmission (by test F1) of at least 75%, shows a haze (by test F2) of not more than 5.0%, or has a lag time by test B of at least 150 h.

2. The single- or double-sided adhesive tape of claim 1, wherein the weight-average molar mass of the (co)polymer (A) is at least 10 000 g/mol and/or at most 200 000 g/mol.

3. The single- or double-sided adhesive tape of claim 1, wherein the curable adhesive composition has pressure-sensitive adhesive properties.

4. The single- or double-sided adhesive tape of claim 1, wherein cycloaliphatic epoxides are used for one, more than one, or all the (meth)acrylic (co)monomers (a) functionalized with an epoxy group.

5. The single- or double-sided adhesive tape of claim 4, wherein the cycloaliphatic epoxides are 3,4-epoxycyclohexyl-substituted monomers.

6. The single- or double-sided adhesive tape of claim 1, wherein the curable adhesive composition further comprises at least one of:
   photoinitiators as curing agent;
   at least one tackifying resin;
   at least one reactive resin that is aliphatic or cycloaliphatic;
   one or more additives; and
   one or more fillers.

7. The single- or double-sided adhesive tape of claim 6, wherein the photoinitiators are present and absorb UV light above 250 nm and below 350 nm.

8. The single- or double-sided adhesive tape of claim 1, wherein the thermally activatable curing agents are present and selected from the group consisting of:
   pyridinium salts;
   ammonium salts;
   sulfonium salts; and
   lanthanoid triflates.

9. The single- or double-sided adhesive tape of claim 1, wherein the single- or double-sided adhesive tape is a transfer adhesive tape or an adhesive tape with no carrier.

10. The single- or double-sided adhesive tape of claim 1, further comprising:
    a carrier having a permeation barrier of water vapor transmission rate <0.1 g/(m² d) and oxygen transmission rate <0.1 cm³/(m² d bar).

11. The single- or double-sided adhesive tape of claim 10, wherein at least one of:
the carrier is a coated polymer film; and
the carrier has a layer of a flexible thin glass having a layer thickness of not more than 1 mm.

12. The single- or double-sided adhesive tape of claim 11, wherein the thin glass is present and in strip geometry.

13. A method for encapsulation of an (opto)electronic arrangement, the method comprising:
applying the single- or double-sided adhesive tape of claim 1 to a substrate.

14. The method of claim 13, further comprising:
heating at least one of the curable adhesive composition and regions of the (opto)electronic arrangement to be encapsulated before, during, and/or after the application of the single- or double-sided adhesive tape.

15. The method of claim 13, wherein the curable adhesive composition is partly or finally crosslinked after application to the (opto)electronic arrangement.

16. An electronic arrangement having an electronic structure, the electronic arrangement comprising:
an (opto)electronic structure at least partly encapsulated by the single- or double-sided adhesive tape of claim 1.

17. The electronic arrangement of claim 16, wherein the curable adhesive composition of the single- or double-sided adhesive tape is in cured form.

* * * * *